United States Patent
Hirosaki et al.

(10) Patent No.: US 9,359,551 B2
(45) Date of Patent: Jun. 7, 2016

(54) PHOSPHOR, MANUFACTURE THEREOF; LIGHT-EMITTING DEVICE, AND IMAGE DISPLAY DEVICE UTILIZING PHOSPHOR

(71) Applicants: Naoto Hirosaki, Ibaraki (JP); Takashi Takeda, Ibaraki (JP); Shiro Funahashi, Ibaraki (JP)

(72) Inventors: Naoto Hirosaki, Ibaraki (JP); Takashi Takeda, Ibaraki (JP); Shiro Funahashi, Ibaraki (JP)

(73) Assignee: National Institute for Materials Science, Tsukuba-shi (JP)

( * ) Notice: Subject to any disclaimer, the term of this patent is extended or adjusted under 35 U.S.C. 154(b) by 754 days.

(21) Appl. No.: 13/690,453

(22) Filed: Nov. 30, 2012

(65) Prior Publication Data

US 2013/0207538 A1 Aug. 15, 2013

Related U.S. Application Data

(63) Continuation of application No. PCT/JP2012/078870, filed on Nov. 7, 2012.

(30) Foreign Application Priority Data

Nov. 7, 2011 (JP) .................................. 2011-243556

(51) Int. Cl.
| | | |
|---|---|---|
| C09K 11/77 | (2006.01) | |
| C09K 11/08 | (2006.01) | |
| H01J 61/44 | (2006.01) | |
| H05B 33/14 | (2006.01) | |
| H01J 1/63 | (2006.01) | |
| H05B 33/12 | (2006.01) | |
| H01L 33/50 | (2010.01) | |

(52) U.S. Cl.
CPC ......... *C09K 11/7786* (2013.01); *C09K 11/0883* (2013.01); *C09K 11/7703* (2013.01); *C09K 11/7718* (2013.01); *C09K 11/7731* (2013.01); *C09K 11/7734* (2013.01); *C09K 11/7746* (2013.01); *C09K 11/7761* (2013.01); *H01J 1/63* (2013.01); *H01J 61/44* (2013.01); *H05B 33/12* (2013.01); *H05B 33/14* (2013.01); *H01L 33/502* (2013.01); *H01L 2224/48091* (2013.01); *H01L 2224/48247* (2013.01); *H01L 2224/73265* (2013.01); *H01L 2224/8592* (2013.01); *H01L 2924/12044* (2013.01)

(58) Field of Classification Search
CPC H01L 35/502; H01L 35/504; C09K 11/0883; C09K 11/7734
See application file for complete search history.

(56) References Cited

U.S. PATENT DOCUMENTS

| | | | | |
|---|---|---|---|---|
| 7,345,418 B2 * | 3/2008 | Nagatomi et al. | ............. | 313/503 |
| 7,476,335 B2 * | 1/2009 | Sakane et al. | ........... | 252/301.4 F |
| 8,007,686 B2 * | 8/2011 | Park et al. | ........................ | 257/98 |
| 8,653,549 B2 * | 2/2014 | Yoo et al. | ........................ | 257/98 |
| 9,062,252 B2 * | 6/2015 | Hirosaki et al. | | |
| 2006/0049414 A1 | 3/2006 | Chandran et al. | | |
| 2006/0192178 A1 | 8/2006 | Hirosaki | | |
| 2007/0007494 A1 | 1/2007 | Hirosaki | | |
| 2007/0018567 A1 | 1/2007 | Hirosaki | | |
| 2007/0108896 A1 | 5/2007 | Hirosaki | | |
| 2009/0096361 A1 | 4/2009 | Fukuda | | |
| 2009/0236969 A1 | 9/2009 | Hirosaki | | |
| 2009/0284948 A1 | 11/2009 | Yamao et al. | | |
| 2011/0057149 A1 | 3/2011 | Asai | | |
| 2011/0058582 A1 | 3/2011 | Asai | | |
| 2011/0058583 A1 | 3/2011 | Asai | | |
| 2011/0121234 A1 | 5/2011 | Hirosaki | | |
| 2012/0119234 A1 | 5/2012 | Hirosaki | | |
| 2013/0001815 A1 | 1/2013 | Yamao et al. | | |
| 2013/0207535 A1 * | 8/2013 | Hirosaki et al. | ............... | 313/486 |
| 2013/0207538 A1 * | 8/2013 | Hirosaki et al. | ............... | 313/504 |

FOREIGN PATENT DOCUMENTS

| | | | |
|---|---|---|---|
| EP | 2036966 A | | 3/2009 |
| JP | 3668770 B | | 4/2005 |
| JP | 3837551 B | | 8/2006 |
| JP | 2009-132916 A | | 6/2009 |
| JP | 4524368 B | | 6/2010 |
| TW | 200730605 | * | 8/2007 |
| WO | WO2008/004640 A1 | | 1/2008 |
| WO | WO 2011/028033 | * | 3/2011 |

OTHER PUBLICATIONS

Office Action from Taiwanese Intellectual Property Office, Feb. 10, 2015.*
Eurppean search report for Application No. 128481255.6, see p. 5-8.

* cited by examiner

*Primary Examiner* — Carol M Koslow
(74) *Attorney, Agent, or Firm* — Trojan Law Offices

(57) ABSTRACT

Provided is a chemically and thermally stable phosphor having different emission characteristics than the conventional phosphor and exhibiting high emission intensity if combined with an LED of 470 nm or less. The phosphor of the present invention is represented by a composition formula: $M_d A_e D_f E_g X_h$ (d+e+f+g+h=1; M is one or more kinds of elements selected from Mn, Ce, Pr, Nd, Sm, Eu, Tb, Dy, and Yb; A is one or more kinds of elements selected from Mg, Ca, Sr, and Ba; D is one or more kinds of elements selected from Si, Ge, Sn, Ti, Zr, and Hf; E is one or more kinds of elements selected from B, Al, Ga, In, Sc, Y, and La; and X is one or more kinds of elements selected from O, N, and F) and parameters d, e, f, g, and h satisfy the predetermined condition.

60 Claims, 4 Drawing Sheets

<001>   <010>   <101>

PHOSPHOR, MANUFACTURE THEREOF; LIGHT-EMITTING DEVICE, AND IMAGE DISPLAY DEVICE UTILIZING PHOSPHOR

CROSS-REFERENCE TO RELATED APPLICATION

This application is a continuation of International Application No. PCT/JP2012/78870, filed on Nov. 7, 2012, the entire contents of which are incorporated herein by reference. This application also claims the benefit of priority from Japanese Patent Application No. 2011-243556 filed on Nov. 7, 2011, the entire contents of which are incorporated herein by reference.

TECHNICAL FIELD

The present invention relates to a phosphor expressed by a compositional formula of $M_dA_eD_fE_gX_h$ (where d+e+f+g+h=1; an M element is one or two or more kinds of elements selected from the group consisting of Mn, Ce, Pr, Nd, Sm, Eu, Tb, Dy, and Yb; an A element is one or two or more kinds of elements selected from the group consisting of Mg, Ca, Sr, and Ba; a D element is one or two or more kinds of elements selected from the group consisting of Si, Ge, Sn, Ti, Zr, and Hf; an E element is one or two or more kinds of elements selected from the group consisting of B, Al, Ga, In, Sc, Y, and La; and an X element is one or two or more kinds of elements selected from the group consisting of O, N, and F).

BACKGROUND ART

A phosphor is utilized in a fluorescent display tube (VFD: vacuum-fluorescent display), a field emission display (FED: Field Emission Display) or SED (Surface-Conduction Electron-Emitter Display), a plasma display panel (PDP: Plasma Display Panel), a cathode-ray tube (CRT: Cathode-Ray Tube), a liquid display backlight (Liquid-Crystal Display Backlight), a white light-emitting diode (LED: Light-Emitting Diode), and so on. In any of these applications, it is necessary to provide the phosphor with energy to excite the phosphor in order to make the phosphor emit fluorescence and the phosphor is excited by an excitation source with high energy such as a vacuum ultraviolet ray, an ultraviolet ray, an electron beam, and blue light so as to emit a visible light ray such as blue light, green light, yellow light, orange light, and red light. However, as a result of the phosphor being exposed to such excitation source, the luminance of the phosphor tends to decrease and a phosphor having little degradation in the brightness is desired. Therefore, a phosphor having an inorganic crystal containing nitrogen in a crystal structure thereof as a host crystal, instead a phosphor such as a silicate phosphor, a phosphate phosphor, a aluminate phosphor, and a sulfide phosphor, has been proposed, as exemplified by a sialon phosphor, an oxynitride phosphor, or a nitride phosphor, which is characterized by low brightness deterioration caused by high energy excitation.

An example of the sialon phosphors is manufactured by a manufacturing process as generally described below. First, silicon nitride ($Si_3N_4$), aluminum nitride (AlN), and europium oxide ($Eu_2O_3$) are mixed in predetermined molar ratios and the resultant mixture is fired by a hot press method in one atmospheric pressure (0.1 MPa) of nitrogen atmosphere at 1700° C. for one hour. It was reported that α-sialon activated with an $Eu^{2+}$ ion manufactured by the above process had become a phosphor emitting light of a yellow color in a wavelength range of 550 nm to 600 nm if excited by blue light having a wavelength range of 450 to 500 nm. Further, it is known that an emission wavelength may vary as a ratio of Si to Al or a ratio of oxygen to nitrogen is changed while the α-sialon crystal structure is maintained.

As another example of the sialon phosphor, a green phosphor in which β type sialon (β-sialon) is activated by $Eu^{2+}$ is known (For example, refer to the specification of Japanese Patent No. 3921545. The document is incorporated herein by reference.). It is known that, in the phosphor, an emission wavelength thereof varies to a shorter wavelength by changing the oxygen content while the crystal structure remains the same. Moreover, it is known that a blue phosphor is to be formed when β-sialon is activated by $Ce^{3+}$ (For example, refer to WO 2006/101096 A. The document is incorporated herein by reference.).

As an example of an oxynitride phosphor, a blue phosphor having a JEM phase ($LaAl(Si_{6-z}Al_z)N_{10-z}O_z$) as a host crystal which is activated by Ce (For example, refer to WO 2005/019376 A. The document is incorporated herein by reference.) is known. It is known that, in the phosphor, an emission wavelength shifts to a longer wavelength as an excitation wavelength shifts to a longer wavelength by substituting partially La with Ca while the crystal structure is maintained.

As another example of the oxynitride phosphor, a blue phosphor having a La—N crystal $La_3Si_8N_{11}O_4$ as a host crystal, which is activated by Ce, is known (For example, refer to Japanese patent application publication No. 2005-112922 A. The document is incorporated herein by reference.).

As an example of a nitride phosphor, a red phosphor having $CaAlSiN_3$ as a host crystal, which is activated by $Eu^{2+}$ is known (For example, refer to Japanese patent No. 3837588 B. The document is incorporated herein by reference.). Color rendering properties of a white LED are improved effectively by utilizing this phosphor. It has been reported that a phosphor to which Ce is added as an optical activating-element becomes an orange phosphor.

Thus, an emission color of the phosphor is determined by a combination of the crystal to act as the host crystal and a metal ion (activating ion) being incorporated into the crystal. Further, the combination of the host crystal and the activating ion determines emission characteristics such as an emission spectrum and an excitation spectrum, chemical stability, and thermal stability such that a phosphor is regarded as another different phosphor when a host crystal thereof or an activating ion thereof is different. Moreover, a material having a different crystal structure is different in the emission characteristics or in the stability because the host crystal is different even if the material has the same chemical composition such that the material is regarded as another different phosphor.

Further, kinds of constituent elements can be substituted in many phosphors while the same crystal structure of the host crystal is maintained, thereby changing the emission color. For example, although a phosphor having a YAG crystal to which Ce is added emits light of a green color, a phosphor having a YAG crystal in which Y is partially substituted with Gd and Al is partially substituted with Ga exhibits emission of a yellow color. Further, in a phosphor having $CaAlSiN_3$ to which Eu is added, it is known that a composition thereof varies by partially substituting Ca with Sr while the same crystal structure is maintained such that the emission wavelength shifts to a shorter wavelength. In this way, such a phosphor in which element substitution is performed while the same crystal structure is maintained is regarded as a material of the same group.

SUMMARY OF THE INVENTION

From the above, it should be understood that it is important to find out a host crystal having a new crystal structure in the development of a new phosphor. However, it is quite difficult to construct a crystal structure artificially as if it were to put building blocks together. That is, a crystal structure is configured as the free energy is minimized or locally minimized by arranging a suitable composition condition and an environmental condition such as temperature and ambient atmosphere. In other words, it is a way to a discovery of a host crystal having a new crystal structure to newly figure out such various conditions. And then, a new phosphor can be proposed by activating such a host crystal with a metal ion performing emission such that the phosphor may exhibit luminescence characteristics.

The present invention aims to satisfy such demand and it is one of the objects to provide an inorganic phosphor that has emission characteristics (emission color, excitation characteristics, emission spectrum) different from those of a conventional phosphor, exhibits high emission intensity even when combined with an LED with a wavelength of 470 nm or less, and is chemically and thermally stable. It is another object of the present invention to provide a light-emitting unit that utilizes such a phosphor and is excellent in durability and an image display device that utilizes such a phosphor and is excellent in durability.

The present inventors investigated in detail a phosphor expressed by a compositional formula of $M_d A_e D_f E_g X_h$ (here, the M element is one or two or more kinds of elements selected from the group consisting of Mn, Ce, Pr, Nd, Sm, Eu, Tb, Dy, and Yb; the A element is one or two or more kinds of elements selected from the group consisting of Mg, Ca, Sr, and Ba; the D element is one or two or more kinds of elements selected from the group consisting of Si, Ge, Sn, Ti, Zr, and Hf; the E element is one or two or more kinds of elements selected from the group consisting of B, Al, Ga, In, Sc, Y, and La; and the X element is one or two or more kinds of elements selected from the group consisting of O, N, and F). After such investigation, it was found that an inorganic substance with a predetermined composition having been obtained by firing a raw material mixture constituting a specific composition under a predetermined condition could constitute a phosphor to emit fluorescence of high brightness.

Further, it was found to be possible to obtain a white color light-emitting diode (light-emitting unit) with a high emission efficiency and a small temperature fluctuation, an illuminating device with the same diode, and an image display device rendering bright coloring by utilizing such phosphor.

The present inventors conducted intensive researches in consideration of the above-mentioned circumstances so as to successfully provide a phosphor rendering emission with a high intensity of a specific wavelength region by implementing the configuration recited in the following. Further, a phosphor having excellent emission characteristics was successfully manufactured by employing a method to be described later. Further, a light-emitting unit, an illuminating device, an image display device, and pigment, ultraviolet absorber having excellent features were successfully provided by utilizing such phosphor and implementing the configuration recited in the following. Specifically, the following may be included.

[1] A phosphor comprising: an inorganic compound wherein the inorganic compound is expressed by a compositional formula of $M_d A_e D_f E_g X_h$ (where d+e+f+g+h=1; the M element is one or two or more kinds of elements selected from the group consisting of Mn, Ce, Pr, Nd, Sm, Eu, Tb, Dy, and Yb; the A element is one or two or more kinds of elements selected from the group consisting of Mg, Ca, Sr, and Ba; the D element is one or two or more kinds of elements selected from the group consisting of Si, Ge, Sn, Ti, Zr, and Hf; the E element is one or two or more kinds of elements selected from the group consisting of B, Al, Ga, In, Sc, Y, and La; and the X element is one or two or more kinds of elements selected from the group consisting of O, N, and F) and parameters d, e, f, g, and h satisfy following condition:

$$0.00001 \le d \le 0.05;$$

$$0.05 \le e \le 0.1;$$

$$0.07 \le f \le 0.3;$$

$$0.07 \le g \le 0.3; \text{ and}$$

$$0.45 \le h \le 0.6.$$

[2] A method of manufacturing a phosphor comprising: firing a raw material mixture of metal compounds, which can constitute the phosphor according to the preceding paragraph by firing the mixture, in a temperature range of 1,200° C. or higher to 2,200° C. or lower in an inert atmosphere including nitrogen.

[3] A light-emitting unit comprising a light-emitting body and a first phosphor wherein the first phosphor is a phosphor recited in the above [1] or a new phosphor disclosed in the drawings or the present specification other than the above [1].

[4] The light-emitting unit according to the above [3], wherein the light-emitting body is an organic EL light-emitting body (OLED), a semiconductor laser, a laser diode (LD), or a light-emitting diode (LED) emitting light of a wavelength of 330 to 500 nm.

[5] The light-emitting unit according to the above [3] or [4], wherein the light-emitting unit is a white light-emitting diode, an illuminating device including a plurality of white light-emitting diodes, or a backlight for a liquid crystal panel.

[6] The light-emitting unit according to any one of the above [3] to [5], further comprising a second phosphor, wherein the light-emitting body emits ultraviolet or visible light having a peak wavelength of 300 to 420 nm, and the light-emitting unit emits white light or light other than the white light by mixing blue light emitted from the first phosphor and light having a wavelength of 470 nm or more emitted from the second phosphor.

[7] The light-emitting unit according to any one of the above [3] to [6], further comprising a blue phosphor being caused to emit light having a peak wavelength of 420 nm to 500 nm or less by the light-emitting body.

[8] The light-emitting unit according to the above [7], wherein the blue phosphor is selected from AlN:(Eu, Si), $BaMgAl_{10}O_{17}$:Eu, $SrSi_9AL_{19}ON_{31}$:Eu, $LaSi_9Al_{19}N_{32}$:Eu, α-sialon:Ce, and JEM:Ce.

[9] The light-emitting unit according to any one of the above [3] to [8], further comprising a green phosphor being caused to emit light having a peak wavelength of 500 nm or more to 550 nm or less by the light-emitting body.

[10] The light-emitting unit according to the above [9], wherein the green phosphor is selected from β-sialon:Eu, (Ba, Sr, Ca, Mg)$_2$SiO$_4$:Eu, and (Ca, Sr, Ba)Si$_2$O$_2$N$_2$:Eu.

[11] The light-emitting unit according to any one of the above [3] to [10], further comprising a yellow phosphor being caused to emit light having a peak wavelength of 550 nm or more to 600 nm or less by the light-emitting body.

[12] The light-emitting unit according to the above [11], wherein the yellow phosphor is selected from YAG:Ce, α-sialon:Eu, CaAlSiN$_3$:Ce, and La$_3$Si$_6$N$_{11}$:Ce.

[13] The light-emitting unit according to any one of the above [3] to [12], further comprising a red phosphor being caused to emit light having a peak wavelength of 600 nm or more to 700 nm or less by the light-emitting body.

[14] The light-emitting unit according to the above [13], wherein the red phosphor is selected from CaAlSiN$_3$:Eu, (Ca,Sr)AlSiN$_3$:Eu, Ca$_2$Si$_5$N$_8$:Eu, and Sr$_2$Si$_5$N$_8$:Eu.

The light-emitting unit according to any one of the above [3] to [14], wherein the light-emitting body is an LED for emitting light having a wavelength of 320 to 420 nm.

[16] An image display device comprising: an excitation source and a phosphor, wherein at least either the phosphor recited in the above [1] or a new phosphor disclosed in the drawings or the present specification other than the above [1] is utilized.

The image display device according to the above [16], wherein the image display device is a fluorescent display tube (VFD), a field emission display (FED), a plasma display panel (PDP), a cathode-ray tube (CRT), or a liquid crystal display (LCD).

A pigment comprising the phosphor recited in the above [1] or a new phosphor disclosed in the drawings or the present specification other than the above [1].

An ultraviolet absorber comprising the phosphor recited in the above [I] or a new phosphor disclosed in the drawings or the present specification other than the above [1].

In accordance with the present invention, it is possible to utilizes, as a phosphor, an inorganic compound satisfying the above composition, which can be obtained by firing a raw material mixture made to be a specific composition in a predetermined condition. It can also be a blue phosphor with high brightness if the composition is well controlled. Further, a white color light-emitting diode (light-emitting unit) having high emission efficiency and little temperature fluctuation can be obtained by utilizing the phosphor, and an illuminating device with the diode and an image display device of bright coloration can also be obtained. Since the brightness of the phosphor does not decrease even when exposed to the excitation source, the present invention provides a useful phosphor suitably used for the light-emitting unit such as the white light-emitting diode, the illuminating device, a backlight source for a liquid crystal, VFD, FED, PDP or CRT. Further, the phosphor absorbs ultraviolet light, and thus the phosphor is suitable for a pigment and ultraviolet absorber.

DETAILED DESCRIPTION OF THE EMBODIMENTS

Figure 1:
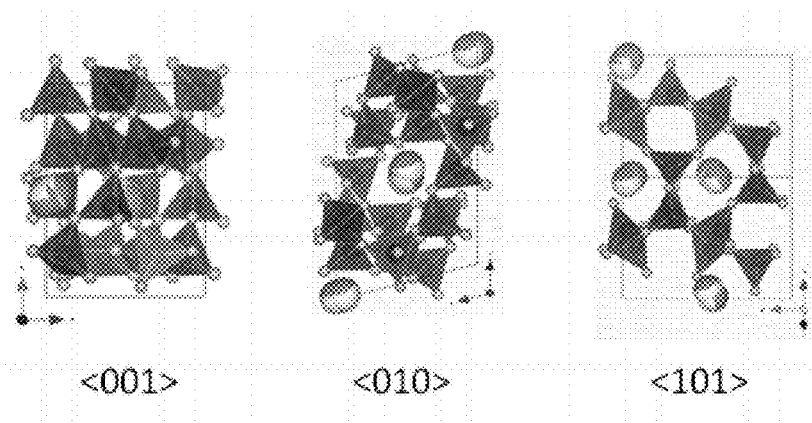
FIG. 1 is a diagram illustrating a crystal structure of Sr$_1$Si$_3$Al$_2$O$_4$N$_4$ crystal.

Hereafter, a phosphor of the present invention is described in detail with reference to the drawings.

A phosphor of the present invention includes an inorganic compound satisfying a composition to be mentioned later, which can be obtained by firing a raw material mixture of a specific composition. Further, a white color light-emitting diode (light-emitting unit) having high emission efficiency and little temperature fluctuation can be obtained by utilizing the phosphor, and an illuminating device with the diode and an image display device of bright coloration can also be obtained. Further, a light-emitting unit, an illuminating device, an image display device, a pigment, and an ultraviolet absorber having excellent characteristics can be obtained by rendering a configuration to be described later and by using this phosphor.

[18] In order to obtain an inorganic compound designated by a composition formula M$_d$A$_e$DfE$_g$X$_h$ (here, in the formula, d+e+f+g+h=1, an M element is one or two or more kinds of elements selected from Mn, Ce, Pr, Nd, Sm, Eu, Tb, Dy, and Yb; an A element is one or two or more kinds of elements selected from Mg, Ca, Sr, and Ba; a D element is one or two or more kinds of elements selected from Si, Ge, Sn, Ti, Zr, and Hf; an E element is one or two or more kinds of elements selected from B, Al, Ga, In, Sc, Y, and La; an X element is one or two or more kinds of elements selected from O, N, and F), and parameters d, e, f, g, and h satisfy all conditions:

$0.00001 \leq d \leq 0.05;$ $0.05 \leq e \leq 0.1;$ $0.07 \leq f \leq 0.3;$ $0.07 \leq g \leq 0.3;$ and $0.45 \leq H \leq 0.6,$ the present inventors fired a predetermined raw material mixture as a raw material under a predetermined condition to find the thus-fired substance to become a phosphor. In other words, it is the phosphor including the inorganic compound having respective parameters satisfying the above formulae in the above composition formula.

The parameter d represents an additive amount of the activating clement, and if the amount is less than 0.00001, an amount of light-emitting ions is insufficient so as to cause brightness to decrease. If the amount is more than 0.05, the emission intensity may be decreased due to the concentration quenching by a mutual interaction between light-emitting ions. The parameter e is a parameter representing a constituent amount of the alkaline earth element such as Ba, and if the amount is less than 0.05 or higher than 0.1, the crystal structure becomes unstable so as to cause the emission intensity to decrease. The parameter f is a parameter representing a constituent amount of the D element such as Si, and if the amount is less than 0.07 or higher than 0.3, the crystal structure becomes unstable so as to cause the emission intensity to decrease. The parameter g is a parameter representing a constituent amount of the E element such as Al, and if the amount is less than 0.07 or higher than 0.3, the crystal structure becomes unstable so as to cause the emission intensity to decrease. The parameter h is a parameter representing a constituent amount of the X element such as 0, N, and F, and if the amount is less than 0.45 or higher than 0.6, the crystal structure becomes unstable so as to cause the emission intensity to decrease. The X element is an anion, and a composition ratio of O, N, and F is determined in order to maintain the charge neutrality with cations of the A, M, D and E elements.

[20] Further, a phosphor including an inorganic compound satisfying the following relationship:

$$0.5/5 \leq (d+e)/(f+g) \leq 2/5$$

in the composition formula recited in the above [18], has excellent fluorescence characteristics.

[21] The phosphor recited in the above [18] or [20] including an inorganic compound satisfying the following relationship:

$$0.9/5 \leq (d+e)/(f+g) \leq 1.2/5$$

in the composition formula recited in the above [18], exhibits emission of high brightness so as to be desirable.

[22] The phosphor recited in any of the above [18] and [20]-[21] including an inorganic compound which further satisfies the following relationship:

$$1.0/5 \leq (d+e)/(f+g) \leq 1.2/5$$

in the composition formula recited in the above [18] exhibits emission of further high brightness so as to be more desirable.

[23] The phosphor recited in any of the above [18] and [20]-[22] including an inorganic compound in which the parameters d, e, f, g, and h have values in the range satisfying all the following conditions:

$$0.06 \leq d+e \leq (1/14)+0.05;$$

$$(5/14)-0.05 \leq f+g \leq (5/14)+0.05; \text{ and}$$

$$(8/14)-0.05 \leq h \leq 0.6$$

in the composition formula recited in the above [18], has desirable fluorescence characteristics.

[24] The phosphor recited in any of the above [18] and [20]-[23] including an inorganic crystal satisfying in particular all the following conditions:

$$d+e=1/14;$$

$$f+g=5/14; \text{ and}$$

$$h=8/14$$

in the preceding paragraph, has a crystal structure (crystal having a composition of $(M, A)_1(Si, Al)_5(O, N)_8$) to be described later that is in particular stable such that the phosphor exhibits particularly high emission intensity.

[25] Further, the phosphor recited in any of the above [18] and [20]-[24] including an inorganic compound in which the parameters f and g satisfy the following condition:

$$2/5 \leq f/(f+g) \leq 4/5$$

in the composition formula recited in the above [18], is desirable. This is because the crystal structure is stable and the emission intensity is high to be described later.

[26] Further, the phosphor recited in any of the above [18] and [20]-[25] including an inorganic compound in which the X element includes N and O in the composition formula recited in the above (0038) and which is designated by a composition formula $M_dA_eD_fE_gO_{h1}N_{h2}$ (here, d+e+f+g+h1+h2=1 and h1+h2=h in the formula) and satisfies the following condition:

$$2/8 < h1/(h1+h2) < 6/8,$$

is desirable. This is because the phosphor is excellent in the fluorescence characteristics.

[27] Further, the phosphor recited in any of the above [18] and [20]-[26] including an inorganic compound preferably satisfying the following condition:

$$3.5/8 \leq h1/(h1+h2) \leq 4.5/8$$

in the composition formula recited in the above [18], is desirable. This is because the phosphor excellent in the fluorescence characteristics. If the ratio of numbers of atoms N and O which are included in the inorganic compound is in such a range, the crystal structure to be described later is stable and the emission intensity is high.

[28] If the phosphor more preferably includes the inorganic compound satisfying the following condition:

$$3.6/8 \leq h1/(h1+h2) \leq 4.1/8$$

in the composition formula, the phosphor exhibits further high emission intensity.

[29] The phosphor recited in any of the above [18] and [20]-[28] and including at least Eu as the M element being the activating element exhibits high emission intensity among the phosphors of the present invention, and the phosphor emits fluorescence having a peak in a wavelength range of 400 nm to 590 nm if the phosphor is irradiated with an excitation source.

[30] The phosphor recited in any of the above [18] and [20]-[29], in which at least Sr and/or Ba is included as the A element; at least Si is included as the D element; at least Al is included as the E element; and at least N and O are included as the X element, is desirable. The phosphor exhibits high emission intensity and emits fluorescence of a blue color having a peak in a wavelength range of 440 nm to 520 nm if it is irradiated with an excitation source. More preferably, it is the phosphor recited in any of the above [18] and [20]-[29] and the present paragraph, and including both Sr and Ba as the A element. In this way, the crystal structure to be mentioned later becomes more stable and the emission intensity of the phosphor becomes high. Further, the phosphor may also include boron as the E element, and in this case, the content amount of boron is 0.001 mass % or more and 1 mass % or less. In this way, the emission intensity can become higher.

When the phosphor having the composition as described above was investigated in detail, it was found that a crystal designated by $Sr_1Si_3Al_2O_4N_4$ was included. The crystal was newly synthesized and confirmed to be a new crystal through the crystal structure analysis by the present inventors, is a crystal which has not been reported prior to the present invention.

FIG. 1 is a diagram showing a crystal structure of $Sr_1Si_3Al_2O_4N_4$ crystal.

According to the single crystal structure analysis performed with respect to the $Sr_1Si_3Al_2O_4N_4$ crystal synthesized by the present inventors as an exemplary inorganic crystal constituted of a crystal designated by $Sr_1Si_3Al_2O_4N_4$, the $Sr_1Si_3Al_2O_4N_4$ crystal belongs to the monoclinic system and the $P2_1$ space group (space group No. 4 in the International Tables for Crystallography), and has crystal parameters and occupancy of the atomic coordinate positions as shown in Table 1.

In Table 1, lattice constants a, b, and c signify respective lengths of the axes of the unit cell, and α, β, and γ signify respective angles between axes of the unit cell. The atomic coordinates indicate a position of each atom in the unit cell in terms of a value between 0 and 1 using the unit cell as a unit. According to the analysis results thus obtained, there were atoms of Sr, Si, Al, O, and N, respectively, there were four kinds of sites: (Sr(1A), Sr(1B), Sr(2A), Sr(2B)) for Sr, Sr(1) occupied a site of Sr(1A) with an occupancy rate of 61.3% and a site of Sr(1B) with an occupancy rate of 38.7%, and Sr(2) occupied a site of Sr(2A) with an occupancy rate of 66.9% and a site of Sr(2B) with an occupancy rate of 33.1%. Also, analysis results that Si and Al occupied ten (10) kinds of sites of SiAl(1) to SiAl(10) without any distinction in the kind were obtained. Further, analysis results that O and N occupied sixteen (16) kinds of sites of NO(1) to NO(16) without any distinction in the kind were obtained.

TABLE 1

Crystal structure data of $Sr_1Si_3Al_2O_4N_4$ crystal
Crystal structure data of Sr1Si3Al2O4N4 crystal

| Crystal | $Sr_1Si_3Al_2O_4N_4$ | | | |
|---|---|---|---|---|
| Formula weight (Z) | 4 | | | |
| Crystal system | Monoclinic | | | |
| Space group | P2_1 | | | |
| Space group number | 4 | | | |
| Lattice constants | a | | 7.2516 Å | |
| | b | | 9.3431 Å | |
| | c | | 10.8761 Å | |
| | α | | 90 degree | |
| | β | | 104.489 degree | |
| | γ | | 90 degree | |

| | Atomic coordinate | | | Site |
|---|---|---|---|---|
| Atom | x | y | z | occupancy rate |
| Sr (1A) | 1.0049 | 0.4644 | −0.0143 | 0.613 |
| Sr (1B) | 1.0559 | 0.4886 | −0.0154 | 0.387 |
| Sr (2A) | 0.5055 | 0.4444 | 0.5126 | 0.669 |
| Sr (2B) | 0.5116 | 0.4722 | 0.475 | 0.331 |
| Si, Al (1) | 0.6257 | 0.6961 | −0.0435 | 1 |
| Si, Al (2) | 0.8847 | 0.6943 | 0.2068 | 1 |
| Si, Al (3) | 1.129 | 0.6926 | 0.4565 | 1 |
| Si, Al (4) | 0.5795 | 0.9187 | 0.1449 | 1 |
| Si, Al (5) | 0.9481 | 0.9738 | 0.3496 | 1 |
| Si, Al (6) | 0.6272 | 0.1944 | 0.2908 | 1 |
| Si, A (7) | 0.5724 | 0.4698 | 0.1417 | 1 |
| Si, Al (8) | 0.3109 | 0.7018 | 0.2343 | 1 |
| Si. Al (9) | 0.9222 | 0.4218 | 0.3638 | 1 |
| Si, Al (10) | 0.7963 | 0.7148 | −0.269 | 1 |
| N, O (1) | 0.5602 | 0.7119 | −0.3548 | 1 |
| N, O (2) | 1.3199 | 0.6912 | 0.3931 | 1 |
| N, O (3) | 1.079 | 0.7087 | 0.1475 | 1 |
| N, O (4) | 0.9407 | 0.6069 | 0.3526 | 1 |
| N, O (5) | 0.811 | 0.7246 | −0.1098 | 1 |
| N, O (6) | 0.4428 | 0.6045 | −0.146 | 1 |
| N, O (7) | 0.722 | 0.5953 | 0.0931 | 1 |
| N, O (8) | 0.795 | 0.097 | 0.4016 | 1 |
| N, O (9) | 0.4329 | 0.852 | 0.2215 | 1 |
| N, O (10) | 0.8905 | 0.854 | −0.327 | 1 |
| N, O (11) | 0.8145 | 0.8691 | 0.2235 | 1 |
| N, O (12) | 1.0767 | 0.8712 | 0.4807 | 1 |
| N, O (13) | 0.5465 | 0.8644 | −0.0119 | 1 |
| N, O (14) | 1.1084 | 1.0599 | 0.2889 | 1 |
| N, O (15) | 0.7037 | 0.3652 | 0.2672 | 1 |
| N, O (16) | 0.4013 | 0.55 | 0.1885 | 1 |

As a result of analysis using data in Table 1, the $Sr_1Si_3Al_2O_4N_4$ crystal was found to have the structure as shown in FIG. 1, in which a Sr element is included in a skeleton formed by linking tetrahedrons constituted of bonds of Si or Al with O or N. The M element to become an activating ion such as Eu in the crystal is incorporated into the crystal in the type of partial substitution of the Sr element.

A crystal having a crystal structure identical to the crystal structure of $Sr_1Si_3Al_2O_4N_4$ crystal, which was synthesized and subjected to the structure analysis, includes an $A_1Si_3Al_2O_4N_4$ crystal and a crystal designated by $A_1(D,E)_5X_8$. The A element is typically Ba or a mixture of Sr and Ba. The X element is typically a mixture of O and N. In an $A_1(Si, Al)_5(O, N)_8$ crystal, Si and Al can occupy sites which Si and Al are supposed to occupy without distinguishing the sites mutually, and O and N can occupy sites which O and N are supposed to occupy without distinguishing the sites mutually. Thus, a relative ratio of numbers of atoms can be adjusted to 1 for the A element, 5 for the sum of Si and Al, and 8 for the sum of O and N while the crystal structure remains the same. However, it is desirable to have a ratio of Si/Al and a ratio of O/N so as to satisfy a condition of the electrical neutrality in the crystal.

The $Sr_1Si_3Al_2O_4N_4$ system crystal of the present invention can be identified by means of the X-ray diffraction or the neutron diffraction. A substance exhibiting the identical diffraction to that of the $Sr_1Si_3Al_2O_4N_4$ system crystal as a result of the X-ray diffraction in the present invention includes a crystal designated by $A_1(D,E)_5X_8$. Further, the substance includes a crystal in which lattice constants or atomic positions are changed by substituting other elements for constituent elements in the $Si_3Al_2O_4N_4$ crystal. Here, specific examples of materials in which the constituent elements are substituted with other elements include a material in which Sr in the $Sr_1Si_3Al_2O_4N_4$ crystal is partially or completely substituted with the A element other than Sr (here, A is one or two or more kinds of elements selected from Mg, Ca, Sr, and Ba) or the M element (here, M is one or two or more kinds of elements selected from Mn, Ce, Pr, Nd, Sm, Eu, Tb, Dy, and Yb). Further, the specific examples include a material in which Si in the crystal is partially or completely substituted with the D element other than Si (here, D is one or two or more kinds of elements selected from Si, Ge, Sn, Ti, Zr, and Hf). Further, the specific examples include a material in which Al in the crystal is partially or completely substituted with the E element other than Al (here, E is one or two or more kinds of elements selected from B, Al, Ga, In, Sc, Y, and La). Further, the specific examples include a material in which O or N in the crystal is partially or completely substituted with fluorine. These substitutions are performed such that neutrality of charges in the whole crystal is maintained. A material in which a crystal structure thereof is not changed as a result of such element substitutions is included in the $Sr_1Si_3Al_2O_4N_4$ system crystal. Since emission characteristics, chemical stability, and thermal stability of the phosphor are changed by the substitution of elements, the substitution of elements may be selectively utilized at an appropriate time for each application thereof as far as the crystal structure remains the same.

In the $Sr_1Si_3Al_2O_4N_4$ system crystal, the lattice constants change as the constituent components are substituted with other elements or as an activating element such as Eu is solid-solved therein, but the atomic positions given by the crystal structure, sites to be occupied by atoms, and coordinates thereof do not significantly change to an extent in which a chemical bond between skeleton atoms is broken. In the present invention, a crystal structure is defined to be identical to that of the $Sr_1Si_3Al_2O_4N_4$ crystal if lengths of chemical bonds (distance of neighboring atoms) of Al—N and Si—N calculated from the lattice constants and atomic coordinates obtained by conducting Rietveld analysis of the results from the X-ray diffraction or the neutron diffraction in the space group of $P2_1$ are compared with lengths of chemical bonds calculated from the lattice constants and atomic coordinates of the $Sr_1Si_3Al_2O_4N_4$ crystal as shown in Table 1 such that the difference between the lengths is within ±5%, and using the definition it is determined whether the crystal having the crystal structure belongs to the $Sr_1Si_3Al_2O_4N_4$ system crystal or not. This determination criterion is employed herein since it was once observed that a crystal in the $Sr_1Si_3Al_2O_4N_4$ system crystal was changed to become another crystal due to breakage of chemical bonds when lengths of the chemical bonds were changed beyond ±5% according to the prior experiments and it was found that the determination criterion could be applied as the standard. Accordingly, the scope of the $Sr_1Si_3Al_2O_4N_4$ system crystal could be made within a range where the crystal would not be changed to become another crystal due to breakage of the chemical bonds, but it is also possible to set such a criterion utilizing numerical values.

Further, in case an amount of solid-solution is small, a simple method for determining whether it belongs to the $Sr_1Si_3Al_2O_4N_4$ system crystal or not is described as follows. A new substance can be identified to have the same crystal structure if main peaks of the resultant X-ray diffraction pattern measured with the new substance are respectively located at diffraction peak positions, which agree with the peak positions (2θ) of the diffraction pattern calculated using the crystal structure data of Table 1 and the lattice constants calculated from the resultant X-ray diffraction pattern.

Figure 2:
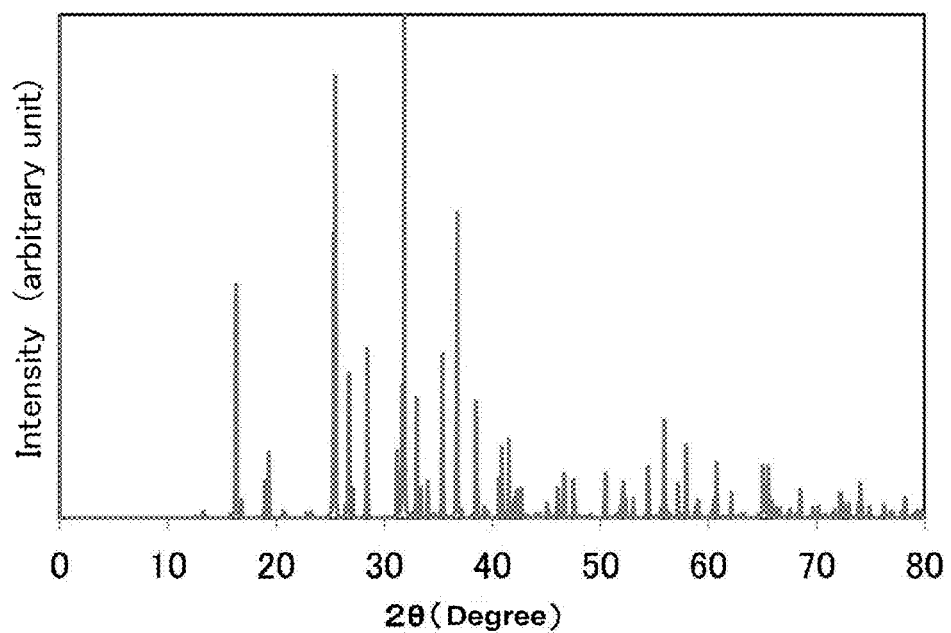
FIG. 2 is a diagram showing a powder X-ray diffraction patter using Cu Kα-line, calculated from a crystal structure of Sr$_1$Si$_3$Al$_2$O$_4$N$_4$ crystal.

FIG. 2 is a diagram showing a powder X-ray diffraction pattern using Cu Kα-line as calculated from the crystal structure of the $Sr_1Si_3Al_2O_4N_4$ system crystal.

A simple judgment whether a substance belongs to the $Sr_1Si_3Al_2O_4N_4$ system crystal or not can be made by comparing an X-ray diffraction pattern of the substance to be compared with the pattern of FIG. 2. It may be good to make a judgment using approximately ten (10) peaks of the highest intensity in the diffraction pattern as the main peaks of the $Sr_1Si_3Al_2O_4N_4$ system crystal. Table 1 is important in this sense since it could be referenced when the identification of the $Sr_1Si_3Al_2O_4N_4$ system crystal is conducted. Further, it is also possible to define a crystal structure of the $Sr_1Si_3Al_2O_4N_4$ system crystal as an approximate structure using another crystal system of the monoclinic crystal and, in such a case, the crystal structure is expressed using a different space group, different lattice constants, and different plane indices, but the X-ray diffraction results (for example, FIG. 2) and the crystal structure (for example, FIG. 1) remain unchanged such that an identification method and an identification result thereof are the same. Therefore, in the present invention, it is to perform an X-ray diffraction analysis using the monoclinic system. The method of identifying the substance based on Table 1 will be concretely described in Examples to be described later, and the explanation of the method described herein is just in general.

[43] As mentioned above, a crystal or a crystal system of $Ba_1Si_3Al_2O_4N_4$ may be included in the $Sr_1Si_3Al_2O_4N_4$ system crystal. The $Ba_1Si_1Al_2O_4N_4$ crystal basically has a structure identical to that shown in FIG. 1, and can exhibit an X-ray diffraction pattern as shown in FIG. 2. Then, in a similar manner with the $Sr_1Si_3Al_2O_4N_4$ crystal, the crystal or the crystal system belongs to the monoclinic system and the $P2_1$ space group (space group No. 4 of the International Tables for Crystallography).

[44] An inorganic compound in which a $Sr_1Si_3Al_2O_4N_4$ system crystal is activated by one or two or more kinds of elements selected from Mn, Ce, Pr, Nd, Sm, Eu, Tb, Dy, Ho, Er, Tm, and Yb as the M element may become a phosphor. That is, in the phosphor recited in any of the above (0038) and (0040)-(0050), an inorganic compound having a predetermined composition may include an inorganic compound comprising a crystal designated by such $Sr_1Si_3Al_2O_4N_4$, an inorganic crystal having a crystal structure identical to that of a crystal designated by $Sr_1Si_3Al_2O_4N_4$, or a solid solution crystal of these inorganic crystals, wherein the M element is solid-solved in the respective crystals. Further, it can be the above-mentioned phosphor characterized in that an inorganic crystal thereof having a crystal structure identical to that of the crystal designated by the above-mentioned $Sr_1Si_3Al_2O_4N_4$ can be either a crystal designated by $A_1Si_3Al_2O_4N_4$ or a crystal designated by $A_1(D,E)_5X_8$. Since emission characteristics such as an excitation wavelength, an emission wavelength, and emission intensity may vary depending on the composition of the $Sr_1Si_3Al_2O_4N_4$ system crystal, and the kind and quantity of the activating element, such conditions may be chosen in accordance with an application thereof. Here, when Eu is included as the M element, a phosphor with high emission intensity can be obtained.

[45] The phosphor, in which the above inorganic crystal recited in the preceding paragraph is either a crystal designated by $A_1Si_1Al_2O_4N_4$ or a crystal designated by $A_1(D,E)_5X_8$, can be characterized in that the A element includes either or both of Sr and Ba; the D element includes Si; the E element includes Al; X element includes N; and the X element includes O if necessary. If the inorganic crystal recited in the preceding paragraph is a crystal designated by $A_1(D, E)_5X_8$; at least the A element includes either or both of Sr and Ba; the D element includes Si; the E element includes Al; X element includes N; and the X element includes O if necessary, the phosphor exhibits high emission intensity. In particular, it is the phosphor exhibiting high emission intensity that includes the $Sr_1Si_3Al_2O_4N_4$ system crystal as the host crystal and has a composition in which A is a mixture of Sr and Ba, D is Si, E is Al, and X is a combination of O and N. It may be a phosphor characterized in that the inorganic crystal recited in the preceding paragraph is a crystal designated by $Sr_1Si_1Al_2O_4N_4$ or a crystal designated by $(Ba, Sr)_1Si_3Al_2O_4N_4$.

[46] The phosphor in which an inorganic crystal thereof having a crystal structure identical to that of the crystal designated by $Sr_1Si_3Al_2O_4N_4$ is $Ba_1Si_3Al_2O_4N_4$ or $(Sr,Ba)_1Si_3Al_2O_4N_4$ exhibits high emission intensity as the crystal is stable. Here, $(Sr, Ba)_1$ represents a molar ratio of 1:13 (5+8=13) in the total molar fraction and the one (1) mole is constituted of Sr and Ba. For example, "$Sr_{0.5}Ba_{0.5}Si_3Al_2O_4N_4$", "$Sr_0Ba_1Si_3Al_2O_4N_4$", and "$Sr_1Ba_0Si_3Al_2O_4N_4$" may be included.

[47] The phosphor in which an inorganic crystal thereof having a crystal structure identical to that of the crystal designated by $Sr_1Si_3Al_2O_4N_4$ includes, as a host crystal, a crystal designated by a composition formula:

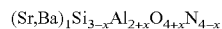

$$(Sr,Ba)_1Si_{3-x}Al_{2+x}O_{4+x}N_{4-x}$$

(here, −1≤x≤2), is a phosphor which exhibits high emission intensity and can be controlled in the color change of the emission by changing a composition thereof.

Here, the identical crystal structure may include a structure to be substantially identical thereto, and also a so-called similar structure thereof. Therefore, the crystal may be said to have the identical structure even if lattice constants thereof are longer or shorter.

In general, a solid solution body means what is constituted of a uniform solid in which one kind of solid is solved into another kind of solid, and solid solution means that the solid becomes in such a state or is in such a state. For example, a state in which, even if another kind of atom enters into a crystal structure of an inorganic compound, the other kind of atom is mixed therein in a solid state while the original crystal structure remains the same may be referred to as the solid-solution, and the body itself in such a state can be referred to as the solid solution body. As more specific examples, the solid solution body includes a substitutional solid solution body and an interstitial solid solution body.

[49] In the substitutional solid solution body, a solvent atom is substituted with a solute atom, and the substitution is likely to occur in case respective atoms are approximately in the same size. It is considered that the complete solid solution may occur over all range of constituent ratio thereof if difference in atomic radii of the respective atoms is up to about 10%, but that the solid solubility is sharply decreased if the difference is more than this, and it is said that the solid solution would not occur if the difference is equal to or more than 15%. This empirical rule is made to be one of the Hume-Rothery's rules. In the interstitial solid solution body, an element having a relatively small atomic radius is supposed to enter into an interstice between atoms of a crystal lattice. The solid solution body described herein may be either or both of them.

In addition, in the case of solid-solution, it is preferable to maintain the charge neutrality as a whole. However, an electron and/or a positive hole may be occasionally generated at least partially in the crystal structure such that the charge neutrality is not necessarily to be achieved only with respect to the element constituting the crystal structure.

[50] Here, while the M element is Eu; the D element is Si; the E element is Al; the X element is O and N; and a parameter x is used, an inorganic compound, in which Eu is solid-solved into a crystal thereof having a composition formula designated by $A_1Si_{3-x}Al_{2+x}O_{4+x}N_{4-x}$, wherein $-1 \leq x \leq 2$,
can be included. Thus, a phosphor performs emission of high brightness can be provided. More preferably, the A element is a combination of Sr and Ba such that a crystal having the above-mentioned crystal structure is stabilized and emission characteristics thereof can be improved. Further preferably, the value of x is zero (0) such that the crystal having the above-mentioned crystal structure is in particular stabilized and the emission intensity can be further improved. The phosphor recited in any of the above [18], [20]-[30], and [44]-[47] including the above-mentioned inorganic compound is desirable.

[51] Here, the inorganic compound, while parameters x and y are used, may be designated by $Eu_y(Sr,Ba)1Si_{3-x}Al_{2+x}O_{4+x}N_{4-x}$, wherein
$-1 \leq x \leq 2$, and
$0.0001 < y \leq 0.5$.
In such a range, it is possible to change a ratio of Eu/(Sr,Ba), a ratio of Si/Al, and a ratio of N/O within a composition range to be constituted by changing the parameters x and y while the stable crystal structure is maintained. Thus, it is a phosphor that is easy to make a material design since an excitation wavelength thereof or an emission wavelength thereof can be continuously changed by utilizing this feature. The phosphor recited in any of the above (0038), (0040)-(0050), (0064)-(0067), and (0070) including the above-mentioned inorganic compound is desirable. And these phosphors including the inorganic compound in which x=0 in the above-mentioned formula are desirable.

[52] In the phosphor recited in any of the above [18], [20]-[30], [44]-[47], and [50]-[51], the A element is a combination of Sr and Ba; the x recited in the preceding paragraph is equal to 0 (x=0); and fluorescence of a blue color having 440 nm or more to 520 nm or less is emitted upon irradiation of light having 295 to 420 nm, such that the phosphor recited in the preceding paragraph is desirable.

In a crystal designated by $Sr_1Si_3Al_2O_4N_4$ or an inorganic crystal having a crystal structure identical to that of the crystal designated by $Sr_1Si_3Al_2O_4N_4$, the inorganic crystal is particularly stable if the inorganic crystal is a crystal that belongs to the monoclinic system, and a phosphor having such crystal as a host crystal exhibits high emission intensity.

A phosphor having a composition, in which at least Sr and Ba are included as the A element; at least Si is included as the D element; at least Al is included as the E element; and at least N and O are included as the X element, has a stable crystal structure and emission intensity thereof is high.

[55] Further, if a crystal designated by $Sr_1Si_3Al_2O_4N_4$ or an inorganic crystal having a crystal structure identical to that of the crystal designated by $Sr_1Si_3Al_2O_4N_4$ is a crystal that belongs to the monoclinic system and has the symmetry of space group $P2_1$, and in which lattice constants thereof a, b, and c are in the following range:

$a=0.72516\pm0.05$ nm;

$b=0.93431\pm0.05$ nm; and $c=1.08761\pm0.05$ nm, the crystal is particularly stable such that a phosphor having such inorganic crystal as a host crystal exhibits high emission intensity. Here, "±0.05" in the above-mentioned formula indicates a tolerance. If a crystal is prepared out of the above range, the crystal may become unstable and the emission intensity may occasionally decrease.

[56] The phosphor recited in any of the above [18], [20]-[30], [44]-[47], and [50]-[52], in which the inorganic compound comprises single crystal particles or an aggregate of the single crystals having a mean particle diameter of 0.1 gm or more to 20 μm or less, is desirable. This is because the emission efficiency is high and the handling property is good when the inorganic compound is applied to an LED. It is also good to control the particle diameter thereof in this range.

[57] The phosphor recited in any of the above [18], [20]-[30], [44]-[47], [50]-[52], and [56], in which the sum of impurity elements of Fe, Co, and Ni included in the inorganic compound is not exceeding 500 ppm, is desirable. The impurity elements of Fe, Co, and Ni could be a cause to lower the emission intensity. If the sum of these impurity elements in the phosphor is controlled to be 500 ppm or less, an influence of these elements on the emission intensity is decreased.

[58] As one of the embodiments of the present invention, the phosphor recited in the above [18], [20]-[30], [44]-[47], [50]-[52], and [56]-[57], in which the above-mentioned inorganic compound and another crystal phase other than this or an amorphous phase are further included and the content amount of the inorganic compound is equal to 20 wt % or more, is desirable. That is, the phosphor constituted of mixtures could allow the content amount of the inorganic compound to be 20 mass % or more. In the case where the phosphor essentially consisting of the above-mentioned inorganic compounds cannot achieve a target property by itself, and in the case where a function such as a conductive property is provided thereto, the present embodiment may be employed. The content amount of the above-mentioned inorganic compound may be adjusted in accordance with the target property, but the emission intensity could be lowered if the amount is 20 mass % or less. Here, one of the examples of the above-mentioned inorganic compound is the $Sr_1Si_3Al_2O_4N_4$ system crystal.

There could be a case in which electrical conductivity is desirable for a phosphor to be excited by an electron beam as an application thereof. The phosphor recited in the preceding paragraph could be a phosphor characterized in that the other crystal phase different than the above inorganic compound or the amorphous phase may be an inorganic substance having the electrical conductivity. And such inorganic substance may be added thereto.

In the phosphor recited in the preceding paragraph, the inorganic substance having the electrical conductivity may be oxide, oxynitride, or nitride of one or two or more kinds of elements selected from Zn, Al, Ga, In, and Sn, or a mixture of these substances. For example, zinc oxide, aluminum nitride, indium nitride, tin oxide, and so on may be named.

In the case where the target emission spectrum cannot be obtained by a phosphor of the above-mentioned inorganic compound by itself, a second phosphor other than the phosphor of the present invention may be added thereto. As examples of the other phosphors, a BAM phosphor, a β-sialon phosphor, an α-sialon phosphor, a $(Sr, Ba)_2Si_5N_8$ phosphor, a $CaAlSiN_3$ phosphor, and a $(Ca, Sr)AlSiN_3$ phosphor may be named. Alternatively, a crystal phase other than the above-mentioned crystal phases or an amorphous phase may be utilized as the other phosphor. Thus, the crystal phase different from the inorganic compound or the amorphous phase recited in the above [58] may function as the phosphor. The phosphor recited in the preceding paragraph may be characterized in that the crystal phase different from the above inorganic compound or the amorphous phase is a phosphor.

[62] As one of the embodiments of the present invention, there is a phosphor having a peak at a wavelength in the range of 400 nm to 590 nm by irradiation with an excitation source. For example, the phosphor of the above-mentioned inorganic compound in which the M element is Eu has an emission peak in this range by adjusting the composition.

[63] As one of the embodiments of the present invention, there is a phosphor having a peak at a wavelength in the range of 440 nm to 520 nm by irradiation with an excitation source. This phosphor may be a phosphor recited in any of the above [18], [20]-[30], [44]-[47], [50]-52], and [56]-[58]. For example, there is a case where the above-mentioned inorganic compound, in which the M element is Eu, the A element is Sr and Ba, the D element is Si, the E element is Al, the X element is N and O, may include an inorganic compound in which Eu is incorporated into the $(Sr, Ba)_1Si_3Al_2O_4N_4$ crystal as solid-solution. In this arrangement, since the phosphor emits blue fluorescence of 440 nm or more to 520 nm or less when the phosphor is irradiated with light of 295 nm to 420 nm, the phosphor may be utilized in an application in which blue color emission is desired, such as a white LED.

(0084) As one of the embodiments of the present invention, the phosphor recited in the preceding paragraph characterized in that the excitation source recited in the preceding paragraph is a vacuum ultraviolet ray, a ultraviolet ray, or visible light, each of which has a wavelength that is in each specific range among from 100 nm to 420 nm, and an electron beam or an X-ray is desirable. The phosphor can be made to emit light efficiently by using such excitation source.

[65] As one of the embodiments of the present invention, the phosphor recited in any of the above [18], [20]-[30], [44]-[47], [50]-[52], [56]-[58], and [63]-[64] and characterized by emitting light upon irradiation of an excitation source wherein a color of the light may be expressed by values of (x, y) on the CIE 1931 chromaticity coordinates which are in the following range:

$$0.05 < x < 0.3; \text{ and}$$

$$0.02 < y < 0.4$$

is desirable. For example, it is possible to obtain a phosphor emitting light of the color in this range on the chromaticity coordinates by allowing the phosphor to include the above inorganic compound having the adjusted composition given by

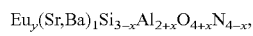

$$-1 \le x \le 2, \text{ and}$$

$$0.0001 < y < 0.5.$$

The obtained phosphor may also be utilized in an application of blue light emission such as a white LED.

[66] Thus, as compared with an ordinary oxide phosphor or an existing sialon phosphor, the phosphor of the present invention is characterized by having a wider excitation range of an electron beam and X-ray and light from ultraviolet light to visible light, emitting light of a blue color, and, in particular, both emitting light of a blue color from 440 nm to 520 nm with a specific composition thereof and being capable of adjusting an emission wavelength and an emission peak width. Thus, the phosphor of the present invention is suitable for an illuminating device, an image display device, pigment, and an ultraviolet absorber because of such emission characteristics. The phosphor of the present invention has also advantages of excellent heat resistance since it does not degrade even if it is exposed to high temperature, and excellent long-term stability under an oxidizing atmosphere and a moisture environment, and thus a product having excellent durability can be provided by utilizing the phosphor.

[67] A method of manufacturing such a phosphor of the present invention is not particularly specified, but the following method is shown as an example. It is a method of manufacturing a phosphor, in which a mixture of metal compounds being a raw material mixture that can constitute the phosphor recited in any of the above [18], [20]-[30], [44]-[47], [50]-[52], [56]-[58], and [63]-[65] is fired in a nitrogen-containing inert atmosphere within the temperature range of 1,200° C. or higher to 2,200° C. or lower. Here, the above-mentioned method of manufacturing the phosphor can be shown as an example, the method being characterized in that the mixture of the above metal compounds comprises a compound including M, a compound including A, a compound including D, a compound including E, and a compound including X (here, M is one or two or more kinds of elements selected from Mn, Ce, Pr, Nd, Sm, Eu, Tb, Dy, and Yb; A is one or two or more kinds of elements selected from Mg, Ca, Sr, and Ba; D is one or two or more kinds of elements selected from Si, Ge, Sn, Ti, Zr, and Hf; E is one or two or more kinds of elements selected from B, Al, Ga, In, Sc, Y, and La; and X is one or two or more kinds of elements selected from O, N, and F).

[68] In the method of manufacturing the phosphor recited in the preceding paragraph, it is possible to show, as an example, the method characterized in that the compound including M is a single substance or a mixture of at least two kinds of substances selected from metal, silicide, oxide, carbonate, nitride, oxynitride, chloride, fluoride, or oxyfluoride including M; the compound including A is a single substance or a mixture of at least two kinds of substances selected from metal, silicide, oxide, carbonate, nitride, oxynitride, chloride, fluoride, or oxyfluoride including A; and the compound including D is a single substance or a mixture of at least two kinds of substances selected from a metal, silicide, oxide, carbonate, nitride, oxynitride, chloride, fluoride or oxyfluoride including D.

[69] As a starting material, for example, a mixture of metal compounds, which comprises a compound including M, a compound including A, a compound including D, a compound including E, and a compound including X (here, M is one or two or more kinds of elements selected from Mn, Ce, Pr, Nd, Sm, Eu, Tb, Dy, and Yb; A is one or two or more kinds of elements selected from Mg, Ca, Sr, and Ba; D is one or two or more kinds of elements selected from Si, Ge, Sn, Ti, Zr, and Hf; E is one or two or more kinds of elements selected from B, Al, Ga, In, Sc, Y, and La; and X is one or two or more kinds of elements selected from O, N, and F), may be satisfactorily used.

[70] As the starting material, the mixture, which comprises the compound including M that is a single substance or a mixture of at least two kinds of substances selected from metal, silicide, oxide, carbonate, nitride, oxynitride, chloride, fluoride, or oxyfluoride including M; the compound including A that is a single substance or a mixture of at least two kinds of substances selected from metal, silicide, oxide, carbonate, nitride, oxynitride, chloride, fluoride, or oxyfluoride including A; and the compound including D that is a single substance or a mixture of at least two kinds of substances selected from a metal, silicide, oxide, carbonate, nitride, oxynitride, chloride, fluoride or oxyfluoride including D, is preferable because these raw materials are easily available and have excellent stability. The compound including X that is a single substance or a mixture of at least two kinds of substances selected from oxide, nitride, oxynitride, fluoride, or oxyfluoride including X is preferable because these raw materials are easily available and have excellent stability.

[71] In the case where the above-mentioned inorganic compound includes a phosphor of the $(Sr, Ba)_1Si_3Al_2O_4N_4$ crystal system activated by Eu, the method of manufacturing the phosphor recited in the above [67], detailed conditions of which are further mentioned in any of the items [68]-[70], is characterized in that a starting material comprising: at least, nitride or oxide of europium; nitride, oxide, or carbonate of strontium and/or nitride, oxide, or carbonate of barium; silicon oxide or silicon nitride; and aluminum oxide or aluminum nitride, is used, such that the method is desirable since the reaction tends to easily proceed during the firing.

[72] In the method of manufacturing the phosphor recited in the above [67], detailed conditions of which are further stated in any of the above [68]-[71], with respect to the furnace to be used therein, an electric furnace of a metal resistance heating type or a graphite resistance heating type, in which a high temperature member of the furnace made of carbon is used, is suitable since the firing temperature is high and the firing atmosphere is an inert atmosphere containing nitrogen. In the manufacturing method of manufacturing the phosphor recited in the item [18] and so on, the raw material mixture is fired in an inert atmosphere containing nitrogen and this inert atmosphere containing nitrogen is a nitrogen gas atmosphere of 0.1 MPa or more and is preferably a nitrogen gas atmosphere of 100 MPa or less. This is because thermal decomposition of nitride or oxynitride of the starting material or the product can be suppressed in the nitrogen-containing inert atmosphere in the pressure range of 0.1 MPa or more to 100 MPa or less. It is preferable that the oxygen partial pressure is 0.0001% or lower in the firing atmosphere in order to suppress the oxidation reaction of nitride or oxynitride of the starting material or the product. Graphite may be satisfactorily used for a heating element, a heat-insulating element, or a sample container of the firing furnace.

[73] The method of manufacturing the phosphor recited in the above [67], detailed conditions of which are further mentioned in any of the above [68]-[72], can be characterized in that metal compounds and the like in a powder state or an aggregate state as being the raw material are fired after they are filled in a container with a filling rate kept at the bulk density of 40% or lower. It is possible to prevent particles from adhering with each other by maintaining the bulk density of 40% or lower in the filling rate. Here, the term relative bulk density means the ratio of a value (bulk density) given by dividing the mass of powder material filled in the container by the capacity of the container to the real density of the substance of the powder material.

[74] In the method of manufacturing the phosphor recited in the above [67], detailed conditions of which are further mentioned in any of the above [68]-[73], a container used in the firing step can be made of boron nitride.

Various kinds of heat-resistant materials can be used for the container containing the raw material compound in firing the raw material mixture. However, in view of a low adverse effect of material deterioration on the metal nitride used in the present invention, a material suitably includes a boron nitride coated container, which is exemplified by a boron nitride coated graphite crucible used for synthesis of an α-sialon as described in a scientific journal "Journal of the American Ceramic Society" Vol. 85, No. 5, pages 1229 to 1234 in 2002 (the document is incorporated herein by reference.), or boron nitride sintered body. When the firing is performed under such conditions, boron or boron nitride component is mixed into the product from the container, but, if the amount thereof is small, an effect of mixing is slight since the emission characteristics are not decreased. Further, durability of the product may be occasionally improved by the addition of a small amount of boron nitride thereto, and such addition may be preferable in some cases.

[75] The method of manufacturing the phosphor recited in the above [67], detailed conditions of which are further mentioned in any of the above [68]-[74], can be characterized in that the mean particle diameter of powder particles or aggregate of the raw material is equal to or less than 500 µm. It is desirable to make the mean particle diameter of powder particles or aggregate of the raw material equal to or less than 500 µm because the raw material has excellent reactivity and handling characteristics.

[76] The method of manufacturing the phosphor recited in the above [67], detailed conditions of which are further mentioned in any of the above [68]-[75], can be characterized in that the mean particle diameter of powder particles or aggregate of the raw material is controlled to be equal to or less than 500 µm by a spray dryer, sieving, or pneumatic classification. It is desirable to employ the spray dryer, the sieving, or the pneumatic classification is employed, because excellent operating efficiency and handling characteristics may be achieved.

[77] The method of manufacturing the phosphor recited in the above [67], detailed conditions of which are further mentioned in any of the above [68]-[76], can be characterized in that means of sintering is only means of pressureless sintering or gas-pressure sintering, but not means of hot-pressing. The means of sintering without applying externally a mechanical pressure such as pressureless sintering and gas-pressure sintering, but not hot-pressing, is desirable as the means to obtain a product of powder or aggregate.

[78] In the method of manufacturing the phosphor recited in the above [67], detailed conditions of which are further mentioned in any of the above [68]-[77], the raw material mixture of metal compounds as described above, which can constitute the above-mentioned inorganic compound by firing, is fired in the inert atmosphere containing nitrogen in a temperature range of 1200° C. or higher and 2200° C. or lower. The phosphor of the present invention can also be obtained by firing the raw material mixture at a temperature of 1,000° C. or higher so as to allow the raw material mixture to react. The above-mentioned firing temperature is preferably 1,200° C. or higher in order to allow the mixture to react more sufficiently, and further preferably, 1,600° C. or higher in order to further promote the reaction. However, it is not preferable that the firing temperature exceeds 2,200° C., although it depends on the kind and the pressure of an atmosphere, since the $Sr_1Si_3Al_2O_4N_4$ system crystal tends to easily proceed with decomposition in the atmosphere of 1 MPa of nitrogen as a main component or 100% nitrogen when the firing temperature exceeds 2,200° C. When ambient pressure becomes higher, the decomposition is suppressed even at a higher temperature, on the other hand, when the ambient pressure becomes lower, the decomposition may occur even at a low temperature. Therefore, in order to suppress the decomposition, it is preferable to perform the firing in higher pressure and at lower temperature. Further, the time period of firing may be satisfactorily shorter at higher temperature and preferably longer at lower temperature. For example, in the case where the firing is performed at 1,600° C., it may be 0.1 hour or longer, more preferably 1 hour or longer, and still further preferably 2 hours or longer. On the other hand, if energy saving or decomposition prevention of the compound is taken into consideration, it is preferably 100 hours or shorter, more preferably 10 hours or shorter, and still further preferably 8 hours or shorter.

As mentioned above, the inorganic compound of the present invention may include an inorganic crystal comprising a crystal belonging to the monoclinic system and the space group $P2_1$ and being designated by $Sr_1Si_3Al_2O_4N_4$, an inorganic crystal having the identical crystal structure to that of the crystal designated by $Sr_1Si_3Al_2O_4N_4$, or an inorganic compound having a solid-solution crystal of these into which the M element is solid-solved, but there may be a case where a crystal belonging to a different crystal system other than the above crystal system or a different space group other than the above space group can be mixed therein depending on a synthesis condition such as firing temperature. Even in such a case, the phosphor can be used as a phosphor of high emission intensity since the change of emission characteristics is light.

The method of manufacturing the phosphor recited in the above [67], detailed conditions of which are further mentioned in any of the above [68]-[78], can be characterized in that a mean particle diameter of phosphor powder synthesized by firing is adjusted to be from 50 nm or more and 200 μm or less by one or more techniques selected from pulverization, classification, and acid treatment. The mean particle diameter of phosphor powder is preferably 50 nm or more to 200 μm or less in terms of a volume-based median diameter (d50) because the emission intensity is high. The volume-based mean particle diameter can be measured, for example, according to a Microtrac or a laser light scattering method. A mean particle diameter of phosphor powder synthesized by firing may be satisfactorily adjusted to be 50 nm or more to 200 μm or less by applying at least one technique selected from pulverization, classification and acid treatment.

The method of manufacturing the phosphor recited in the above [67], detailed conditions of which are further mentioned in any of the above [68]-[78], can be characterized in that a phosphor powder after firing, a phosphor powder after pulverizing treatment, or a phosphor powder after adjusting a particle size thereof can be heat-treated at a temperature equal to or higher than 1000° C. and equal to or lower than the firing temperature. The defect or the damage caused by pulverization being included in the powder may be occasionally cured by such a heat-treatment. The defect or the damage may occasionally cause a decrease in the emission intensity, and in such a case, the emission intensity recovers by the heat treatment.

[82] The method of manufacturing the phosphor recited in the above [67], detailed conditions of which are further mentioned in any of the above [68J-[78], can be characterized by adding an inorganic compound forming a liquid phase at a temperature of a firing temperature or lower to the metal compound mixture and firing the thus-obtained mixture. During firing for synthesis of the phosphor, a stable crystal may be occasionally obtained by adding such an inorganic compound such that the liquid phase acts as a flux to promote the reaction and particle growth, and thus the emission intensity may be occasionally improved.

[83] The method of manufacturing recited in the preceding paragraph can be characterized in that the inorganic compound forming the liquid phase at the temperature of the firing temperature or lower includes a single substance or a mixture of two or more kinds of fluoride, chloride, iodide, bromide, or phosphate of one or two or more kinds of elements selected from Li, Na, K, Mg, Ca, Sr, and Ba. Since these inorganic compounds to form a liquid phase at a temperature of the firing temperature or lower have different melting points, respectively, and thus, respective inorganic compounds may be satisfactorily used properly depending on the synthesis temperature.

The method of manufacturing the phosphor recited in the above [67], detailed conditions of which are further mentioned in any of the above [82]-[83], can be characterized in that a content amount of the inorganic compound producing the liquid phase at the temperature equal to or less than the firing temperature is reduced by washing with a solvent after firing. The emission intensity of the phosphor may occasionally become high by reducing the content amount of the inorganic compound forming the liquid phase at the temperature of the firing temperature or lower.

When the phosphor of the present invention is used in an application of a light-emitting unit or the like, it is preferable to use the phosphor dispersed in a liquid medium. Further, the phosphor can also be used in the form of a phosphor mixture containing the phosphor of the present invention. A composition prepared by dispersing the phosphor of the present invention in the liquid medium is referred to as a phosphor-containing composition.

As the liquid medium that can be used for the phosphor-containing composition of the present invention, any liquid medium can be selected depending on a purpose or the like, if the liquid medium shows liquid properties under desired use conditions to suitably disperse the phosphor of the present invention, and simultaneously does not cause an undesirable reaction or the like. Specific examples of the liquid medium include an addition reaction type silicone resin and a condensation reaction type silicone resin before curing, a modified silicone resin, an epoxy resin, a polyvinyl resin, a polyethylene resin, a polypropylene resin, and a polyester resin. With respect to the liquid media, a single kind of liquid medium may be used by itself, or any combination of two or more kinds of liquid media with any combination ratio thereof may be used.

An amount of used liquid medium or media may be appropriately adjusted depending on an application or the like. In general, the amount is in the range of generally 3 wt % or more and preferably 5 wt % or more, to generally 30 wt % or less and preferably 15 wt % or less in terms of the weight ratio of the liquid medium to the phosphor of the present invention.

Further, the phosphor-containing composition of the present invention may contain, in addition to the phosphor and the liquid medium, any other component depending on an application or the like. Specific examples of any other component include a dispersing agent, a thickening agent, an extending agent and a buffering agent. Specifically, the examples include silica fine powder such as Aerosil, and alumina.

The light-emitting device of the present invention is configured with at least a light-emitting body or an emission source and the phosphor (hereinafter, referred to as first phosphor) of the present invention.

As the light-emitting body or the emission source, there are an LED light-emitting device, a laser diode light-emitting device, an electroluminescence (EL) light-emitting device, a fluorescent lamp, and so on. The LED light-emitting unit can be manufactured using the phosphor of the present invention and a publicly known method which is described in Japanese Patent Application Publication No. H05-152609, Japanese Patent Application Publication No. H07-99345, Japanese Patent No. 2927279, and the like. In this case, the light-emitting body or the emission source is preferably what emits light of a wavelength region of from 330 to 500 nm. In particular, an LED light-emitting element emitting an ultraviolet (or violet) ray of a wavelength region of 330 to 420 nm, or an LED light-emitting element emitting blue light in a wavelength region of 420 to 480 nm is preferable. Such LED light-emitting elements include a nitride semiconductor such as GaN or InGaN, which can be an emission source of a predetermined wavelength by adjusting the composition.

As a light-emitting unit of the present invention, there are a white light-emitting diode, an illuminating device including a plurality of white light-emitting diodes, a backlight for a liquid crystal panel, and the like, which include the phosphor of the present invention, respectively.

In such light-emitting devices, in addition to the first phosphor, the device may further include one or two or more kinds of phosphor selected from β-sialon phosphor activated with Eu, α-sialon yellow phosphor activated with Eu, $Sr_2Si_5N_8$ orange phosphor activated with Eu, (Ca, Sr)$AlSiN_3$ orange phosphor activated with Eu, and $CaAlSiN_3$ red phosphor activated with Eu. As the yellow phosphor other than the above, for example, YAG:Ce, (Ca, Sr, Ba)$Si_2O_2N_2$:Eu, and the like may be used.

As one aspect of the light-emitting unit of the present invention, there is a light-emitting unit in which a light-emitting body or an emission source emits ultraviolet light or visible light having a peak wavelength of 300 to 420 nm such that the phosphor of the present invention emits light of a blue color, which is mixed with light having a wavelength of 470 nm or more emitted by the other phosphor (also, referred to as a second phosphor) of the present invention such that the light-emitting unit emits light of a white color or light of another color other than the white color.

As one aspect of the light-emitting unit of the present invention, in addition to the first phosphor, a blue phosphor emitting light having a peak wavelength of 420 nm to 500 nm or less by means of the light-emitting body or the emission source can further be included. Specific examples of such a blue phosphor include AlN:(Eu, Si), $BaMgAl_{10}O_{17}$:Eu, $SrSi_9Al_{19}O_{31}$:Eu, $LaSi_9Al_{39}N_{32}$:Eu, α-sialon:Ce, JEM:Ce, and so on.

As one aspect of the light-emitting unit of the present invention, in addition to the first phosphor, a green phosphor emitting light having a peak wavelength of 500 nm or more to 550 nm or less by means of the light-emitting body or the emission source can further be included. Specific examples of such a green phosphor include β-sialon:Eu, (Ba, Sr, Ca, Mg)$_2SiO_4$:Eu, (Ca, Sr, Ba)$Si_2O_2N_2$:Eu, and so on.

As one aspect of the light-emitting unit of the present invention, in addition to the first phosphor, a yellow phosphor emitting light having a peak wavelength of 550 nm or more to 600 nm or less by mean of the light-emitting body or the emission source can further be included. Specific examples of such a yellow phosphor include YAG:Ce, α-sialon:Eu, $CaAlSiN_3$:Ce, $La_3Si_6N_{11}$:Ce, and so on.

As one aspect of the light-emitting unit of the present invention, in addition to the first phosphor, a red phosphor emitting light having a peak wavelength of 600 nm or more to 700 nm or less by means of the light-emitting body or the emission source can be further included. Specific examples of such a red phosphor include $CaAlSiN_3$:Eu, (Ca, Sr)$AlSiN_3$:Eu, $Ca_2Si_5N_8$:Eu, $Sr_2Si_5/N_8$:Eu, and so on.

As one aspect of the light-emitting unit of the present invention, a light-emitting unit with high efficiency can be configured since the emission efficiency is high if an LED in which the light-emitting body or the emission source emits light having a wavelength of 320 to 420 nm is used.

The image display device of the present invention is configured with at least an excitation source and the phosphor of the present invention and includes a vacuum fluorescent display (VFD), a field emission display (FED), a plasma display panel (PDP), a cathode-ray tube (CRT), and the like. It has been confirmed that the phosphor of the present invention emits light by excitation of a vacuum ultraviolet ray of 100 to 190 nm, an ultraviolet ray of 190 to 380 nm, an electron beam, or the like, and the above image display devices can be configured by combining these excitation sources and the phosphors of the present invention.

The phosphor comprising an inorganic compound having a specific chemical composition according to the present invention has a white color as an object color, and thus can be used as a pigment or fluorescent pigment. That is, the object color of white is observed when the phosphor of the present invention is irradiated with sunlight or light from a fluorescent lamp or the like. In view of a good coloring and no degradation over a long period of time, the phosphor of the present invention is suitable for an inorganic pigment. Therefore, when the phosphor of the present invention is used for a paint, ink, color, glaze, colorant to be added to a plastic product or the like, a favorable coloring can be maintained at a high level for a long period of time.

The nitride phosphor of the present invention absorbs ultraviolet light and therefore is suitable also as the ultraviolet absorber. Thus, when the nitride phosphor of the present invention is used as the paint or applied onto a surface of the plastic product or kneaded into an inside thereof, the nitride phosphor has a high effect on screening ultraviolet light to effectively allow protection of a product from ultraviolet degradation.

EXAMPLES

The present invention will be described in more detail with reference to the examples to be shown below, but these examples are disclosed only for the purpose of facilitating understanding the present invention readily such that the present invention is not limited to these examples.

[Raw Materials Used for Synthesis]

The raw material powders used for the synthesis were: silicon nitride powder with a particle size of specific surface area of 11.2 $m^2$/g, oxygen content of 1.29 wt %, and a type content of 95% (SN-E10 grade made by Ube Industries, Ltd.); silicon dioxide powder ($SiO_2$; made by Kojundo Chemical Laboratory Co., Ltd.); aluminum nitride powder with a particle size of specific surface area of 3.3 $m^2$/g and oxygen content of 0.82 wt % (E grade made by Tokuyama Corporation); aluminum oxide powder with a particle size of specific surface area of 13.2 $m^2$/g (TAIMICRON made by Daimei Chemicals Co., Ltd.); calcium oxide (made by Kojundo Chemical Laboratory Co., Ltd.); strontium oxide (made by Kojundo Chemical Laboratory Co., Ltd.); barium oxide (BaO; made by Kojundo Chemical Laboratory Co., Ltd.); cerium oxide ($CeO_2$; with purity of 99.9% made by Shin-Etsu Chemical Co., Ltd.); europium oxide ($Eu_2O_3$; with purity of 99.9% made by Shin-Etsu Chemical Co., Ltd.); and rare earth oxide (purity of 99.9% made by Shin-Etsu Chemical Co., Ltd.).

[Synthesis and Structure Analysis of $Sr_1Si_3Al_2O_4N_4$ Crystal]

A mixture composition having fractions of silicon nitride of 40.56 mass %, aluminum oxide of 29.48 mass %, and strontium oxide of 29.96 mass % was designed. These raw material powders were weighed to be a mixture composition, and mixed for 5 minutes using a pestle and a mortar, each of them being made of sintered silicon nitride body. Next, the powder mixture obtained was fed into a crucible made of sintered boron nitride body. A bulk density of the powder mixture (powder) was approximately 30%.

The crucible containing the powder mixture was set into an electric furnace of a graphite resistance heating type. In the firing operation, first the firing atmosphere was made vacuum of $1 \times 10^{-2}$ Pa or less with a diffusion pump, and heated from the room temperature to 800° C. at a rate of 500° C. per hour. Nitrogen of 99.999 vol % purity was introduced at 800° C. to raise the pressure inside the furnace to 1 MPa, and the temperature was further raised to 1900° C. at a rate of 500° C. per hour, and then the temperature was maintained for two (2) hours.

A synthesized material was observed by means of an optical microscope and a crystal particle having a size of 17 μm×10 μm×10 μm was collected out of the synthesized material. The crystal particle was analyzed using a scanning electron microscope (SEM; SU1510 made by Hitachi High-Technologies Corp.) equipped with an energy dispersive elemental analyzer (EDS; QUANTAX made by Bruker AXS Inc.) so as to perform the elemental analysis for the elements included in the crystal particle. As a result, presence of Sr, Si, Al, and N elements was confirmed, and ratios of the respective number of contained atoms of Sr, Si, and Al were measured to be 1:3:2.

Next, the crystal was fixed to a tip top of a glass fiber with an organic adhesive. An X-ray diffraction measurement of the crystal was performed under a condition in which an output of an X-ray source was 50 kV and 50 mA using a single crystal X-ray diffractometer with a rotating target of Mo Kα-line (SMART APEX II Ultra made by Bruker AXS Inc.). As a result, the crystal particle was confirmed to be a single crystal.

Next, the crystal structure of the crystal was determined using single crystal structure analysis software (APEX2 made by Bruker AXS Inc.) from the results of X-ray diffraction measurement. The crystal structure data obtained are shown in Table 1, and diagrams of the crystal structure are shown in FIG. 1. The crystal system, the space group, the lattice constants, and the kinds and positions of atoms are described in Table 1, and the shape and the size of the unit cell and the arrangement of atoms therein can be determined using the data. In addition, Si and Al enter in equivalent atom positions with a certain ratio, and oxygen and nitrogen enter in equivalent atom positions at a certain ratio, and when the ratios are averaged as a whole, the averaged ratio matches the composition fractions of the crystal. The R value ($R_1$) being a value showing reliability of analysis results was 0.0659, and highly reliable analysis results were obtained.

It was found that the crystal belonged to the monoclinic system, and belonged to the space group $P2_1$ (space group No. 4 of the International Tables for Crystallography), and the lattice constants a, b, and c were determined as follows: a=0.72516 nm; b=0.93431 nm; c=1.08761 nm; angle α=90°; β=104.489°; and γ=90°. Further, the atom positions were determined as shown in Table 1. Here, Si and Al exist in the equivalent atom positions with a certain ratio which should be determined by the composition thereof, and O and N exist in the equivalent atom positions with a certain ratio which should be determined by the composition thereof. Further, Sr has +2 valence, Al has +3 valence and Si has +4 valence, and therefore when atom positions and ratios of Sr, Al, and Si are found, a ratio of O to N occupying the positions of (O, N) can be determined from the condition of electrical neutrality of the crystal. The composition of the crystal obtained from Sr:Si:Al ratios having been measured by means of EDS and crystal structure data was found to be $Sr_1Si_3Al_2O_4N_4$. Further, a difference between the starting material composition and the crystal composition might has been caused by formation of a small amount of a second phase having a composition other than $Sr_1Si_1Al_2O_4N_4$. However, the analysis results show a structure of pure $Sr_1Si_3Al_2O_4N_4$ because the single crystal was used in the measurement.

When a similar composition thereof was examined, the $Sr_1Si_3Al_2O_4N_4$ crystal was found to allow Ba to substitute partially or entirely Sr while the crystal structure remains the same. More specifically, the crystal of $A_1Si_3Al_2N_4O_4$ (A is one or two kinds of elements (or mixture) selected from Sr and Ba) has a crystal structure identical to the crystal structure of the $Sr_1Si_3Al_2O_4N_4$ crystal. Further, with respect to the crystal, it was confirmed that Al could substitute partially Si, Si could substitute partially Al, and oxygen could substitute partially N, and that the crystal was one of the compositions of the crystal group having the same crystal structure as $Sr_1Si_3Al_2O_4N_4$ does. Further, the crystal can also be described as a composition designated by:

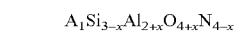

(here, −1≤x≤2), from the condition of electrical neutrality.

From the crystal structure data, it was confirmed that the crystal was a new substance having not been reported so far. A powder X-ray diffraction pattern calculated from the crystal structure data is shown in FIG. 2. Hereafter, it is possible to determine the formation of the $Sr_1Si_3Al_2O_4N_4$ system crystal by performing a powder X-ray diffraction measurement of the synthesized product and comparing the measured powder X-ray diffraction pattern with that of FIG. 2 to find they are the same. Further, since the powder X-ray pattern can be calculated from values of the lattice constants obtained from the powder X-ray diffraction measurement and the crystal structure data of Table 1 with respect to what retains the same crystal structure as the $Sr_1Si_3Al_2O_4N_4$ system crystal and has the varied lattice constants, the formation of the $Sr_1Si_3Al_2O_4N_4$ system crystal can be judged by comparing the measured pattern with the calculated pattern.

Examples and Comparative Example of Phosphors

Example 1 to Example 66

According to the design compositions as shown in Table 2, raw materials were weighed to be mixture compositions (molar ratios) as shown in Table 4. Here, the parameters in Table 2 are converted as appropriate and summarized in Table 3. Although there may be a case in which a design composition in Table 2 and a corresponding mixture composition in Table 4 show difference in the composition depending on the kind of each raw material to be used, the mixture composition was determined such that the amount of each metal ion matches therebetween in such a case. Weighed raw material powders were mixed for 5 minutes using a pestle and a mortar made of silicon nitride sintered body. Then, the mixed powders were fed into a crucible made of boron nitride sintered body. A bulk density of the powder body was approximately from 20% to 30%.

The crucible containing the mixed powders was set into an electric furnace of a graphite resistance heating type. In the firing operation, first the firing atmosphere was made vacuum of $1\times10^{-1}$ Pa or less with a diffusion pump, the furnace was heated from the room temperature to 800° C. at a rate of 500° C. per hour, nitrogen of 99.999 vol % purity was introduced at 800° C. to raise the pressure to 1 MPa inside the furnace, the temperature was further raised to each firing temperature as shown in Table 5 at a rate of 500° C. per hour, and the temperature was maintained for each period of time as shown in Table 5.

TABLE 2

Design Compositions in Examples and Comparative Examples of Phosphor Synthesis
Design compositions in examples and comparative examples of phosphor synthesis

| Example | | M element | | A element | | D element Si | E element Al | X element O | X element N | Composition formula parameters d | e | f | g | h |
|---|---|---|---|---|---|---|---|---|---|---|---|---|---|---|
| Comparative example | 1 | | 0.00 | Sr | 1.00 | 3.0 | 2.0 | 4.0 | 4.0 | 0.0000 | 0.0714 | 0.2143 | 0.1429 | 0.5714 |
| Example | 2 | Eu | 0.02 | Sr | 0.98 | 3.0 | 2.0 | 4.0 | 4.0 | 0.0014 | 0.0700 | 0.2143 | 0.1429 | 0.5714 |
| Example | 3 | Eu | 0.05 | Sr | 0.95 | 3.0 | 2.0 | 4.0 | 4.0 | 0.0036 | 0.0679 | 0.2143 | 0.1429 | 0.5714 |
| Example | 4 | Eu | 0.05 | Mg | 0.95 | 3.0 | 2.0 | 4.0 | 4.0 | 0.0036 | 0.0679 | 0.2143 | 0.1429 | 0.5714 |
| Example | 5 | Eu | 0.05 | Ca | 0.95 | 3.0 | 2.0 | 4.0 | 4.0 | 0.0036 | 0.0679 | 0.2143 | 0.1429 | 0.5714 |
| Example | 6 | Eu | 0.05 | Ba | 0.95 | 3.0 | 2.0 | 4.0 | 4.0 | 0.0036 | 0.0679 | 0.2143 | 0.1429 | 0.5714 |
| Example | 7 | Eu | 0.05 | Sr, Ba | 0.95 | 3.0 | 2.0 | 4.0 | 4.0 | 0.0036 | 0.0679 | 0.2143 | 0.1429 | 0.5714 |
| Example | 8 | Eu | 0.05 | Sr | 0.95 | 4.0 | 1.0 | 3.0 | 5.0 | 0.0036 | 0.0679 | 0.2857 | 0.0714 | 0.5714 |
| Example | 9 | Eu | 0.05 | Sr | 0.95 | 3.5 | 1.5 | 3.5 | 4.5 | 0.0036 | 0.0679 | 0.2500 | 0.1071 | 0.5714 |
| Example | 10 | Eu | 0.05 | Sr | 0.95 | 2.5 | 2.5 | 4.5 | 3.5 | 0.0036 | 0.0679 | 0.1786 | 0.1786 | 0.5714 |
| Example | 11 | Ce | 0.05 | Sr | 0.95 | 3.0 | 2.0 | 4.0 | 4.0 | 0.0036 | 0.0679 | 0.2143 | 0.1429 | 0.5714 |
| Example | 12 | Pr | 0.05 | Sr | 0.95 | 3.0 | 2.0 | 4.0 | 4.0 | 0.0036 | 0.0679 | 0.2143 | 0.1429 | 0.5714 |
| Example | 13 | Sm | 0.05 | Sr | 0.95 | 3.0 | 2.0 | 4.0 | 4.0 | 0.0036 | 0.0679 | 0.2143 | 0.1429 | 0.5714 |
| Example | 14 | Gd | 0.05 | Sr | 0.95 | 3.0 | 2.0 | 4.0 | 4.0 | 0.0036 | 0.0679 | 0.2143 | 0.1429 | 0.5714 |
| Example | 15 | Tb | 0.05 | Sr | 0.95 | 3.0 | 2.0 | 4.0 | 4.0 | 0.0036 | 0.0679 | 0.2143 | 0.1429 | 0.5714 |
| Example | 16 | Dy | 0.05 | Sr | 0.95 | 3.0 | 2.0 | 4.0 | 4.0 | 0.0036 | 0.0679 | 0.2143 | 0.1429 | 0.5714 |
| Example | 17 | Er | 0.05 | Sr | 0.95 | 3.0 | 2.0 | 4.0 | 4.0 | 0.0036 | 0.0679 | 0.2143 | 0.1429 | 0.5714 |
| Example | 18 | Yb | 0.05 | Sr | 0.95 | 3.0 | 2.0 | 4.0 | 4.0 | 0.0036 | 0.0679 | 0.2143 | 0.1429 | 0.5714 |
| Example | 19 | Ce, Eu | 0.05 | Sr | 0.95 | 3.0 | 2.0 | 4.0 | 4.0 | 0.0036 | 0.0679 | 0.2143 | 0.1429 | 0.5714 |
| Example | 20 | Eu, Tb | 0.05 | Sr | 0.95 | 3.0 | 2.0 | 4.0 | 4.0 | 0.0036 | 0.0679 | 0.2143 | 0.1429 | 0.5714 |
| Example | 21 | Eu | 0.05 | Sr, Ba | 0.95 | 3.0 | 2.0 | 4.0 | 4.0 | 0.0036 | 0.0679 | 0.2143 | 0.1429 | 0.5714 |
| Example | 22 | Eu | 0.01 | Sr, Ba | 0.99 | 3.0 | 2.0 | 4.0 | 4.0 | 0.0007 | 0.0707 | 0.2143 | 0.1429 | 0.5714 |
| Example | 23 | Eu | 0.03 | Sr, Ba | 0.97 | 3.0 | 2.0 | 4.0 | 4.0 | 0.0021 | 0.0693 | 0.2143 | 0.1429 | 0.5714 |
| Example | 24 | Eu | 0.08 | Sr, Ba | 0.92 | 3.0 | 2.0 | 4.0 | 4.0 | 0.0057 | 0.0657 | 0.2143 | 0.1429 | 0.5714 |
| Example | 25 | Eu | 0.12 | Sr, Ba | 0.88 | 3.0 | 2.0 | 4.0 | 4.0 | 0.0086 | 0.0629 | 0.2143 | 0.1429 | 0.5714 |
| Example | 26 | Eu | 0.03 | Sr | 0.97 | 3.0 | 2.0 | 4.0 | 4.0 | 0.0021 | 0.0693 | 0.2143 | 0.1429 | 0.5714 |
| Example | 27 | Eu | 0.03 | Sr, Ba | 0.97 | 3.0 | 2.0 | 4.0 | 4.0 | 0.0021 | 0.0693 | 0.2143 | 0.1429 | 0.5714 |
| Example | 28 | Eu | 0.03 | Sr, Ba | 0.97 | 3.0 | 2.0 | 4.0 | 4.0 | 0.0021 | 0.0693 | 0.2143 | 0.1429 | 0.5714 |
| Example | 29 | Eu | 0.03 | Sr, Ba | 0.97 | 3.0 | 2.0 | 4.0 | 4.0 | 0.0021 | 0.0693 | 0.2143 | 0.1429 | 0.5714 |
| Example | 30 | Eu | 0.03 | Sr, Ba | 0.97 | 3.0 | 2.0 | 4.0 | 4.0 | 0.0021 | 0.0693 | 0.2143 | 0.1429 | 0.5714 |
| Example | 31 | Eu | 0.03 | Sr, Ba | 0.97 | 3.0 | 2.0 | 4.0 | 4.0 | 0.0021 | 0.0693 | 0.2143 | 0.1429 | 0.5714 |
| Example | 32 | Eu | 0.03 | Ba | 0.97 | 3.0 | 2.0 | 4.0 | 4.0 | 0.0021 | 0.0693 | 0.2143 | 0.1429 | 0.5714 |
| Example | 33 | Eu | 0.05 | Ca, Sr | 0.95 | 3.0 | 2.0 | 4.0 | 4.0 | 0.0036 | 0.0679 | 0.2143 | 0.1429 | 0.5714 |
| Example | 34 | Eu | 0.05 | Ca, Ba | 0.95 | 3.0 | 2.0 | 4.0 | 4.0 | 0.0036 | 0.0679 | 0.2143 | 0.1429 | 0.5714 |
| Example | 35 | Eu | 0.05 | Sr, Ba | 0.95 | 4.0 | 1.0 | 3.0 | 5.0 | 0.0036 | 0.0679 | 0.2857 | 0.0714 | 0.5714 |
| Example | 36 | Eu | 0.05 | Sr, Ba | 0.95 | 3.5 | 1.5 | 3.5 | 4.5 | 0.0036 | 0.0679 | 0.2500 | 0.1071 | 0.5714 |
| Example | 37 | Eu | 0.05 | Sr, Ba | 0.95 | 3.0 | 2.0 | 4.0 | 4.0 | 0.0036 | 0.0679 | 0.2143 | 0.1429 | 0.5714 |
| Example | 38 | Eu | 0.05 | Sr, Ba | 0.95 | 2.5 | 2.5 | 4.5 | 3.5 | 0.0036 | 0.0679 | 0.1786 | 0.1786 | 0.5714 |
| Example | 39 | Eu | 0.05 | Sr, Ba | 0.95 | 2.0 | 3.0 | 5.0 | 3.0 | 0.0036 | 0.0679 | 0.1429 | 0.2143 | 0.5714 |
| Example | 40 | Eu | 0.05 | Sr, Ba | 0.95 | 1.0 | 4.0 | 6.0 | 2.0 | 0.0036 | 0.0679 | 0.0714 | 0.2857 | 0.5714 |
| Example | 41 | Eu | 0.05 | Sr, Ba | 0.95 | 3.0 | 2.0 | 4.0 | 4.0 | 0.0036 | 0.0679 | 0.2143 | 0.1429 | 0.5714 |
| Example | 42 | Eu | 0.01 | Sr, Ba | 0.99 | 3.0 | 2.0 | 4.0 | 4.0 | 0.0007 | 0.0707 | 0.2143 | 0.1429 | 0.5714 |
| Example | 43 | Eu | 0.03 | Sr, Ba | 0.97 | 3.0 | 2.0 | 4.0 | 4.0 | 0.0021 | 0.0693 | 0.2143 | 0.1429 | 0.5714 |
| Example | 44 | Eu | 0.08 | Sr, Ba | 0.92 | 3.0 | 2.0 | 4.0 | 4.0 | 0.0057 | 0.0657 | 0.2143 | 0.1429 | 0.5714 |
| Example | 45 | Eu | 0.12 | Sr, Ba | 0.88 | 3.0 | 2.0 | 4.0 | 4.0 | 0.0086 | 0.0629 | 0.2143 | 0.1429 | 0.5714 |
| Example | 46 | Eu | 0.03 | Sr | 0.97 | 3.0 | 2.0 | 4.0 | 4.0 | 0.0021 | 0.0693 | 0.2143 | 0.1429 | 0.5714 |
| Example | 47 | Eu | 0.03 | Sr, Ba | 0.97 | 3.0 | 2.0 | 4.0 | 4.0 | 0.0021 | 0.0693 | 0.2143 | 0.1429 | 0.5714 |
| Example | 48 | Eu | 0.03 | Sr, Ba | 0.97 | 3.0 | 2.0 | 4.0 | 4.0 | 0.0021 | 0.0693 | 0.2143 | 0.1429 | 0.5714 |
| Example | 49 | Eu | 0.03 | Sr, Ba | 0.97 | 3.0 | 2.0 | 4.0 | 4.0 | 0.0021 | 0.0693 | 0.2143 | 0.1429 | 0.5714 |
| Example | 50 | Eu | 0.03 | Sr, Ba | 0.97 | 3.0 | 2.0 | 4.0 | 4.0 | 0.0021 | 0.0693 | 0.2143 | 0.1429 | 0.5714 |
| Example | 51 | Eu | 0.03 | Sr, Ba | 0.97 | 3.0 | 2.0 | 4.0 | 4.0 | 0.0021 | 0.0693 | 0.2143 | 0.1429 | 0.5714 |
| Example | 52 | Eu | 0.03 | Ba | 0.97 | 3.0 | 2.0 | 4.0 | 4.0 | 0.0021 | 0.0693 | 0.2143 | 0.1429 | 0.5714 |
| Example | 53 | Eu | 0.05 | Ca, Sr | 0.95 | 3.0 | 2.0 | 4.0 | 4.0 | 0.0036 | 0.0679 | 0.2143 | 0.1429 | 0.5714 |
| Example | 54 | Eu | 0.05 | Ca, Ba | 0.95 | 3.0 | 2.0 | 4.0 | 4.0 | 0.0036 | 0.0679 | 0.2143 | 0.1429 | 0.5714 |
| Example | 55 | Eu | 0.05 | Sr, Ba | 0.95 | 4.0 | 1.0 | 3.0 | 5.0 | 0.0036 | 0.0679 | 0.2857 | 0.0714 | 0.5714 |
| Example | 56 | Eu | 0.05 | Sr, Ba | 0.95 | 3.5 | 1.5 | 3.5 | 4.5 | 0.0036 | 0.0679 | 0.2500 | 0.1071 | 0.5714 |
| Example | 57 | Eu | 0.05 | Sr, Ba | 0.95 | 3.0 | 2.0 | 4.0 | 4.0 | 0.0036 | 0.0679 | 0.2143 | 0.1429 | 0.5714 |
| Example | 58 | Eu | 0.05 | Sr, Ba | 0.95 | 2.5 | 2.5 | 4.5 | 3.5 | 0.0036 | 0.0679 | 0.1786 | 0.1786 | 0.5714 |
| Example | 59 | Eu | 0.05 | Sr, Ba | 0.95 | 2.0 | 3.0 | 5.0 | 3.0 | 0.0036 | 0.0679 | 0.1429 | 0.2143 | 0.5714 |
| Example | 60 | Eu | 0.05 | Sr, Ba | 0.95 | 1.0 | 4.0 | 6.0 | 2.0 | 0.0036 | 0.0679 | 0.0714 | 0.2857 | 0.5714 |
| Example | 61 | Eu | 0.05 | Sr | 0.85 | 3.0 | 2.0 | 4.2 | 3.8 | 0.0036 | 0.0612 | 0.2158 | 0.1439 | 0.5755 |

TABLE 2-continued

Design Compositions in Examples and Comparative Examples of Phosphor Synthesis
Design compositions in examples and comparative examples of phosphor synthesis

| Example | | M element | | A element | | D element Si | E element Al | X element O | N | Composition formula parameters d | e | f | g | h |
|---|---|---|---|---|---|---|---|---|---|---|---|---|---|---|
| Example | 62 | Eu | 0.05 | Sr | 0.90 | 3.0 | 2.0 | 4.1 | 3.9 | 0.0036 | 0.0645 | 0.2151 | 0.1434 | 0.5735 |
| Example | 63 | Eu | 0.05 | Sr | 0.95 | 3.0 | 2.0 | 4.0 | 4.0 | 0.0036 | 0.0679 | 0.2143 | 0.1429 | 0.5714 |
| Example | 64 | Eu | 0.05 | Sr | 1.00 | 3.0 | 2.0 | 3.9 | 4.1 | 0.0036 | 0.0712 | 0.2135 | 0.1423 | 0.5694 |
| Example | 65 | Eu | 0.05 | Sr | 1.05 | 3.0 | 2.0 | 3.8 | 4.2 | 0.0035 | 0.0745 | 0.2128 | 0.1418 | 0.5674 |
| Example | 66 | Eu | 0.05 | Sr | 1.15 | 3.0 | 2.0 | 3.6 | 4.4 | 0.0035 | 0.0810 | 0.2113 | 0.1408 | 0.5634 |

TABLE 3

Parameters' Conversion of Design Compositions in Examples and Comparative Examples of Phosphor Synthesis
Parameters conversion of design compositions in examples and comparative examples of phosphor synthesis

| Example | | (d + e)/(f + g) | d + e | f + g | f/(f + g) | h1/(h1 + h2) |
|---|---|---|---|---|---|---|
| Comparative example | 1 | 0.2000 | 0.0714 | 0.3571 | 0.6000 | 0.5000 |
| Example | 2 | 0.2000 | 0.0714 | 0.3571 | 0.6000 | 0.5000 |
| Example | 3 | 0.2000 | 0.0714 | 0.3571 | 0.6000 | 0.5000 |
| Example | 4 | 0.2000 | 0.0714 | 0.3571 | 0.6000 | 0.5000 |
| Example | 5 | 0.2000 | 0.0714 | 0.3571 | 0.6000 | 0.5000 |
| Example | 6 | 0.2000 | 0.0714 | 0.3571 | 0.6000 | 0.5000 |
| Example | 7 | 0.2000 | 0.0714 | 0.3571 | 0.6000 | 0.5000 |
| Example | 8 | 0.2000 | 0.0714 | 0.3571 | 0.8000 | 0.3750 |
| Example | 9 | 0.2000 | 0.0714 | 0.3571 | 0.7000 | 0.4375 |
| Example | 10 | 0.2000 | 0.0714 | 0.3571 | 0.5000 | 0.5625 |
| Example | 11 | 0.2000 | 0.0714 | 0.3571 | 0.6000 | 0.5000 |
| Example | 12 | 0.2000 | 0.0714 | 0.3571 | 0.6000 | 0.5000 |
| Example | 13 | 0.2000 | 0.0714 | 0.3571 | 0.6000 | 0.5000 |
| Example | 14 | 0.2000 | 0.0714 | 0.3571 | 0.6000 | 0.5000 |
| Example | 15 | 0.2000 | 0.0714 | 0.3571 | 0.6000 | 0.5000 |
| Example | 16 | 0.2000 | 0.0714 | 0.3571 | 0.6000 | 0.5000 |
| Example | 17 | 0.2000 | 0.0714 | 0.3571 | 0.6000 | 0.5000 |
| Example | 18 | 0.2000 | 0.0714 | 0.3571 | 0.6000 | 0.5000 |
| Example | 19 | 0.2000 | 0.0714 | 0.3571 | 0.6000 | 0.5000 |
| Example | 20 | 0.2000 | 0.0714 | 0.3571 | 0.6000 | 0.5000 |
| Example | 21 | 0.2000 | 0.0714 | 0.3571 | 0.6000 | 0.5000 |
| Example | 22 | 0.2000 | 0.0714 | 0.3571 | 0.6000 | 0.5000 |
| Example | 23 | 0.2000 | 0.0714 | 0.3571 | 0.6000 | 0.5000 |
| Example | 24 | 0.2000 | 0.0714 | 0.3571 | 0.6000 | 0.5000 |
| Example | 25 | 0.2000 | 0.0714 | 0.3571 | 0.6000 | 0.5000 |
| Example | 26 | 0.2000 | 0.0714 | 0.3571 | 0.6000 | 0.5000 |
| Example | 27 | 0.2000 | 0.0714 | 0.3571 | 0.6000 | 0.5000 |
| Example | 28 | 0.2000 | 0.0714 | 0.3571 | 0.6000 | 0.5000 |
| Example | 29 | 0.2000 | 0.0714 | 0.3571 | 0.6000 | 0.5000 |
| Example | 30 | 0.2000 | 0.0714 | 0.3571 | 0.6000 | 0.5000 |
| Example | 31 | 0.2000 | 0.0714 | 0.3571 | 0.6000 | 0.5000 |
| Example | 32 | 0.2000 | 0.0714 | 0.3571 | 0.6000 | 0.5000 |
| Example | 33 | 0.2000 | 0.0714 | 0.3571 | 0.6000 | 0.5000 |
| Example | 34 | 0.2000 | 0.0714 | 0.3571 | 0.6000 | 0.5000 |
| Example | 35 | 0.2000 | 0.0714 | 0.3571 | 0.8000 | 0.3750 |
| Example | 36 | 0.2000 | 0.0714 | 0.3571 | 0.7000 | 0.4375 |
| Example | 37 | 0.2000 | 0.0714 | 0.3571 | 0.6000 | 0.5000 |
| Example | 38 | 0.2000 | 0.0714 | 0.3571 | 0.5000 | 0.5625 |
| Example | 39 | 0.2000 | 0.0714 | 0.3571 | 0.4000 | 0.6250 |
| Example | 40 | 0.2000 | 0.0714 | 0.3571 | 0.2000 | 0.7500 |
| Example | 41 | 0.2000 | 0.0714 | 0.3571 | 0.6000 | 0.5000 |
| Example | 42 | 0.2000 | 0.0714 | 0.3571 | 0.6000 | 0.5000 |
| Example | 43 | 0.2000 | 0.0714 | 0.3571 | 0.6000 | 0.5000 |
| Example | 44 | 0.2000 | 0.0714 | 0.3571 | 0.6000 | 0.5000 |
| Example | 45 | 0.2000 | 0.0714 | 0.3571 | 0.6000 | 0.5000 |
| Example | 46 | 0.2000 | 0.0714 | 0.3571 | 0.6000 | 0.5000 |
| Example | 47 | 0.2000 | 0.0714 | 0.3571 | 0.6000 | 0.5000 |
| Example | 48 | 0.2000 | 0.0714 | 0.3571 | 0.6000 | 0.5000 |
| Example | 49 | 0.2000 | 0.0714 | 0.3571 | 0.6000 | 0.5000 |
| Example | 50 | 0.2000 | 0.0714 | 0.3571 | 0.6000 | 0.5000 |
| Example | 51 | 0.2000 | 0.0714 | 0.3571 | 0.6000 | 0.5000 |
| Example | 52 | 0.2000 | 0.0714 | 0.3571 | 0.6000 | 0.5000 |
| Example | 53 | 0.2000 | 0.0714 | 0.3571 | 0.6000 | 0.5000 |
| Example | 54 | 0.2000 | 0.0714 | 0.3571 | 0.6000 | 0.5000 |
| Example | 55 | 0.2000 | 0.0714 | 0.3571 | 0.8000 | 0.3750 |
| Example | 56 | 0.2000 | 0.0714 | 0.3571 | 0.7000 | 0.4375 |
| Example | 57 | 0.2000 | 0.0714 | 0.3571 | 0.6000 | 0.5000 |
| Example | 58 | 0.2000 | 0.0714 | 0.3571 | 0.5000 | 0.5625 |
| Example | 59 | 0.2000 | 0.0714 | 0.3571 | 0.4000 | 0.6250 |
| Example | 60 | 0.2000 | 0.0714 | 0.3571 | 0.2000 | 0.7500 |
| Example | 61 | 0.1800 | 0.0647 | 0.3597 | 0.6000 | 0.5250 |
| Example | 62 | 0.1900 | 0.0681 | 0.3584 | 0.6000 | 0.5125 |
| Example | 63 | 0.2000 | 0.0714 | 0.3571 | 0.6000 | 0.5000 |
| Example | 64 | 0.2100 | 0.0747 | 0.3559 | 0.6000 | 0.4875 |
| Example | 65 | 0.2200 | 0.0780 | 0.3546 | 0.6000 | 0.4750 |
| Example | 66 | 0.2400 | 0.0845 | 0.3521 | 0.6000 | 0.4500 |

TABLE 4

Mixture Compositions of Raw Material in Examples and Comparative Examples of Phosphor Synthesis
Mixture composition of raw material in examples and comparative examples of phosphor synthesis

| Example | | Mixture composition of raw material (molar ratios) | | | | | | | | |
|---|---|---|---|---|---|---|---|---|---|---|
| | | Si3N4 | SiO2 | AlN | Al2O3 | MgO | CaO | SrO | BaO | M oxide, M nitride |
| Comparative example | 1 | 1.000 | | | 1.000 | | | 1.000 | | 0.000 |
| Example | 2 | 1.000 | | 0.007 | 0.997 | | | 0.980 | | Eu2O3  0.010 |
| Example | 3 | 1.000 | | 0.017 | 0.992 | | | 0.950 | | Eu2O3  0.025 |
| Example | 4 | 1.000 | | 0.017 | 0.992 | 0.950 | | | | Eu2O3  0.025 |
| Example | 5 | 1.000 | | 0.017 | 0.992 | | 0.950 | | | Eu2O3  0.025 |

TABLE 4-continued

Mixture Compositions of Raw Material in Examples and Comparative Examples of Phosphor Synthesis
Mixture composition of raw material in examples and comparative examples of phosphor synthesis

| Example | | Si3N4 | SiO2 | AlN | Al2O3 | MgO | CaO | SrO | BaO | M oxide, M nitride | | | |
|---|---|---|---|---|---|---|---|---|---|---|---|---|---|
| Example | 6 | 1.000 | | 0.017 | 0.992 | | | | 0.950 | Eu2O3 | 0.025 | | |
| Example | 7 | 1.000 | | 0.017 | 0.992 | | | 0.475 | 0.475 | Eu2O3 | 0.025 | | |
| Example | 8 | 1.333 | | | 0.658 | | | 0.950 | | Eu2O3 | 0.025 | | |
| Example | 9 | 1.167 | | | 0.825 | | | 0.950 | | Eu2O3 | 0.025 | | |
| Example | 10 | 0.833 | | 0.183 | 1.158 | | | 0.950 | | Eu2O3 | 0.025 | | |
| Example | 11 | 1.000 | | 0.017 | 0.992 | | | 0.950 | | CeO2 | 0.050 | | |
| Example | 12 | 1.000 | | 0.017 | 0.992 | | | 0.950 | | Pr6O11 | 0.008 | | |
| Example | 13 | 1.000 | | 0.017 | 0.992 | | | 0.950 | | Sm2O3 | 0.025 | | |
| Example | 14 | 1.000 | | 0.017 | 0.992 | | | 0.950 | | Gd2O3 | 0.025 | | |
| Example | 15 | 1.000 | | 0.017 | 0.992 | | | 0.950 | | Tb4O7 | 0.013 | | |
| Example | 16 | 1.000 | | 0.017 | 0.992 | | | 0.950 | | Dy2O3 | 0.025 | | |
| Example | 17 | 1.000 | | 0.017 | 0.992 | | | 0.950 | | Er2O3 | 0.025 | | |
| Example | 18 | 1.000 | | 0.017 | 0.992 | | | 0.950 | | Yb2O3 | 0.025 | | |
| Example | 19 | 1.000 | | 0.017 | 0.992 | | | 0.950 | | CeO2 | 0.025 | Eu2O3 | 0.013 |
| Example | 20 | 1.000 | | 0.017 | 0.992 | | | 0.950 | | Eu2O3 | 0.013 | Tb4O7 | 0.006 |
| Example | 21 | 1.000 | | 0.017 | 0.992 | | | 0.475 | 0.475 | Eu2O3 | 0.025 | | |
| Example | 22 | 1.000 | | 0.003 | 0.998 | | | 0.495 | 0.495 | Eu2O3 | 0.005 | | |
| Example | 23 | 1.000 | | 0.010 | 0.995 | | | 0.485 | 0.485 | Eu2O3 | 0.015 | | |
| Example | 24 | 1.000 | | 0.027 | 0.987 | | | 0.460 | 0.460 | Eu2O3 | 0.040 | | |
| Example | 25 | 1.000 | | 0.040 | 0.980 | | | 0.440 | 0.440 | Eu2O3 | 0.060 | | |
| Example | 26 | 1.000 | | 0.010 | 0.995 | | | 0.970 | | Eu2O3 | 0.015 | | |
| Example | 27 | 1.000 | | 0.010 | 0.995 | | | 0.873 | 0.097 | Eu2O3 | 0.015 | | |
| Example | 28 | 1.000 | | 0.010 | 0.995 | | | 0.679 | 0.291 | Eu2O3 | 0.015 | | |
| Example | 29 | 1.000 | | 0.010 | 0.995 | | | 0.485 | 0.485 | Eu2O3 | 0.015 | | |
| Example | 30 | 1.000 | | 0.010 | 0.995 | | | 0.291 | 0.679 | Eu2O3 | 0.015 | | |
| Example | 31 | 1.000 | | 0.010 | 0.995 | | | 0.097 | 0.873 | Eu2O3 | 0.015 | | |
| Example | 32 | 1.000 | | 0.010 | 0.995 | | | | 0.970 | Eu2O3 | 0.015 | | |
| Example | 33 | 1.000 | | 0.017 | 0.992 | | 0.475 | 0.475 | | Eu2O3 | 0.025 | | |
| Example | 34 | 1.000 | | 0.017 | 0.992 | | 0.475 | | 0.475 | Eu2O3 | 0.025 | | |
| Example | 35 | 1.004 | 0.988 | 1.000 | | | | 0.475 | 0.475 | Eu2O3 | 0.025 | | |
| Example | 36 | 0.754 | 1.238 | 1.500 | | | | 0.475 | 0.475 | Eu2O3 | 0.025 | | |
| Example | 37 | 1.000 | | 0.017 | 0.992 | | | 0.475 | 0.475 | Eu2O3 | 0.025 | | |
| Example | 38 | 0.833 | | 0.183 | 1.158 | | | 0.475 | 0.475 | Eu2O3 | 0.025 | | |
| Example | 39 | 0.667 | | 0.350 | 1.325 | | | 0.475 | 0.475 | Eu2O3 | 0.025 | | |
| Example | 40 | 0.333 | | 0.683 | 1.658 | | | 0.475 | 0.475 | Eu2O3 | 0.025 | | |
| Example | 41 | 1.000 | | 0.017 | 0.992 | | | 0.475 | 0.475 | Eu2O3 | 0.025 | | |
| Example | 42 | 1.000 | | 0.003 | 0.998 | | | 0.495 | 0.495 | Eu2O3 | 0.005 | | |
| Example | 43 | 1.000 | | 0.010 | 0.995 | | | 0.485 | 0.485 | Eu2O3 | 0.015 | | |
| Example | 44 | 1.000 | | 0.027 | 0.987 | | | 0.460 | 0.460 | Eu2O3 | 0.040 | | |
| Example | 45 | 1.000 | | 0.040 | 0.980 | | | 0.440 | 0.440 | Eu2O3 | 0.060 | | |
| Example | 46 | 1.000 | | 0.010 | 0.995 | | | 0.970 | | Eu2O3 | 0.015 | | |
| Example | 47 | 1.000 | | 0.010 | 0.995 | | | 0.873 | 0.097 | Eu2O3 | 0.015 | | |
| Example | 48 | 1.000 | | 0.010 | 0.995 | | | 0.679 | 0.291 | Eu2O3 | 0.015 | | |
| Example | 49 | 1.000 | | 0.010 | 0.995 | | | 0.485 | 0.485 | Eu2O3 | 0.015 | | |
| Example | 50 | 1.000 | | 0.010 | 0.995 | | | 0.291 | 0.679 | Eu2O3 | 0.015 | | |
| Example | 51 | 1.000 | | 0.010 | 0.995 | | | 0.097 | 0.873 | Eu2O3 | 0.015 | | |
| Example | 52 | 1.000 | | 0.010 | 0.995 | | | | 0.970 | Eu2O3 | 0.015 | | |
| Example | 53 | 1.000 | | 0.017 | 0.992 | | 0.475 | 0.475 | | Eu2O3 | 0.025 | | |
| Example | 54 | 1.000 | | 0.017 | 0.992 | | 0.475 | | 0.475 | Eu2O3 | 0.025 | | |
| Example | 55 | 1.004 | 0.988 | 1.000 | | | | 0.475 | 0.475 | Eu2O3 | 0.025 | | |
| Example | 56 | 0.754 | 1.238 | 1.500 | | | | 0.475 | 0.475 | Eu2O3 | 0.025 | | |
| Example | 57 | 1.000 | | 0.017 | 0.992 | | | 0.475 | 0.475 | Eu2O3 | 0.025 | | |
| Example | 58 | 0.833 | | 0.183 | 1.158 | | | 0.475 | 0.475 | Eu2O3 | 0.025 | | |
| Example | 59 | 0.667 | | 0.350 | 1.325 | | | 0.475 | 0.475 | Eu2O3 | 0.025 | | |
| Example | 60 | 0.333 | | 0.683 | 1.658 | | | 0.475 | 0.475 | Eu2O3 | 0.025 | | |
| Example | 61 | 0.950 | 0.150 | | 1.000 | | | 0.850 | | EuO | 0.050 | | |
| Example | 62 | 0.975 | 0.075 | | 1.000 | | | 0.900 | | EuO | 0.050 | | |
| Example | 63 | 1.000 | | | 1.000 | | | 0.950 | | EuO | 0.050 | | |
| Example | 64 | 1.000 | | 0.100 | 0.950 | | | 1.000 | | EuO | 0.050 | | |
| Example | 65 | 1.000 | | 0.200 | 0.900 | | | 1.050 | | EuO | 0.050 | | |
| Example | 66 | 1.000 | | 0.400 | 0.900 | | | 1.150 | | EuO | 0.050 | | |

TABLE 5

Firing Conditions in Examples and
Comparative Examples of Phosphor Synthesis
Firing conditions in examples and
comparative examples of phosphor synthesis

| Example | | Firing conditions | |
|---|---|---|---|
| | | Temperature (° C.) | Time |
| Comparative example | 1 | 1600 | 2 |
| Example | 2 | 1600 | 2 |
| Example | 3 | 1600 | 2 |
| Example | 4 | 1600 | 2 |
| Example | 5 | 1600 | 2 |
| Example | 6 | 1600 | 2 |
| Example | 7 | 1600 | 2 |
| Example | 8 | 1600 | 2 |
| Example | 9 | 1600 | 2 |
| Example | 10 | 1600 | 2 |
| Example | 11 | 1600 | 2 |
| Example | 12 | 1600 | 2 |
| Example | 13 | 1600 | 2 |
| Example | 14 | 1600 | 2 |
| Example | 15 | 1600 | 2 |
| Example | 16 | 1600 | 2 |
| Example | 17 | 1600 | 2 |
| Example | 18 | 1600 | 2 |
| Example | 19 | 1600 | 2 |
| Example | 20 | 1600 | 2 |
| Example | 21 | 1600 | 2 |
| Example | 22 | 1600 | 2 |
| Example | 23 | 1600 | 2 |
| Example | 24 | 1600 | 2 |
| Example | 25 | 1600 | 2 |
| Example | 26 | 1600 | 2 |
| Example | 27 | 1600 | 2 |
| Example | 28 | 1600 | 2 |
| Example | 29 | 1600 | 2 |
| Example | 30 | 1600 | 2 |
| Example | 31 | 1600 | 2 |
| Example | 32 | 1600 | 2 |
| Example | 33 | 1600 | 2 |
| Example | 34 | 1600 | 2 |
| Example | 35 | 1600 | 2 |
| Example | 36 | 1600 | 2 |
| Example | 37 | 1600 | 2 |
| Example | 38 | 1600 | 2 |
| Example | 39 | 1600 | 2 |
| Example | 40 | 1600 | 2 |
| Example | 41 | 1600 | 6 |
| Example | 42 | 1600 | 6 |
| Example | 43 | 1600 | 6 |
| Example | 44 | 1600 | 6 |
| Example | 45 | 1600 | 6 |
| Example | 46 | 1600 | 6 |
| Example | 47 | 1600 | 6 |
| Example | 48 | 1600 | 6 |
| Example | 49 | 1600 | 6 |
| Example | 50 | 1600 | 6 |
| Example | 51 | 1600 | 6 |
| Example | 52 | 1600 | 6 |
| Example | 53 | 1600 | 6 |
| Example | 54 | 1600 | 6 |
| Example | 55 | 1600 | 6 |
| Example | 56 | 1600 | 6 |
| Example | 57 | 1600 | 6 |
| Example | 58 | 1600 | 6 |
| Example | 59 | 1600 | 2 |
| Example | 60 | 1600 | 2 |
| Example | 61 | 1700 | 2 |
| Example | 62 | 1700 | 2 |
| Example | 63 | 1700 | 2 |
| Example | 64 | 1700 | 2 |
| Example | 65 | 1700 | 2 |
| Example | 66 | 1700 | 2 |

Next, each synthesized compound was ground using an agate mortar. The ground synthesized material was measured with the EDS and it was confirmed that each synthesized material included a rare earth element, an alkaline earth metal, Si, Al, O, and N, that is, the thus-obtained inorganic compound had a thus-determined composition as mentioned above.

Here, a portion in which a raw material mixture composition and a chemical composition of the synthesized product show discrepancy has a trace amount of substance mixed in the synthesized product as an impurity secondary phase.

After firing, the obtained firing products were crushed coarsely and further ground by hand using a crucible and mortar made of silicon nitride sintered body, and then allowed to pass a 30 μm-mesh sieve. When the particle size distribution was measured, the mean particle diameter was 3 to 8 μm.

These powders were irradiated with light from a lamp to emit light having a wavelength of 365 nm, and as a result, the synthesized materials were confirmed to emit light of a blue color to a red color. An emission spectrum and an excitation spectrum of the powder were measured using a spectrophotofluorometer. Excitation and emission spectra are shown in FIG. 3 and peak wavelengths of excitation spectra and emission spectra are shown in Table 6.

Figure 3:
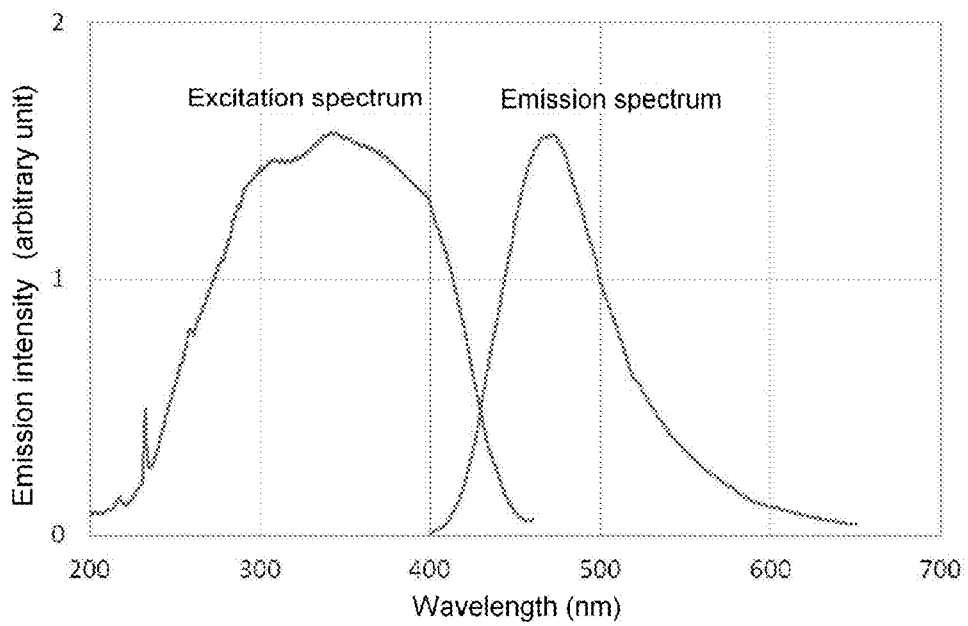
FIG. 3 is a diagram showing an excitation spectrum and an emission spectrum of a phosphor synthesized in Example 21.

FIG. 3 is a diagram showing an excitation spectrum and an emission spectrum of the phosphor synthesized in Example 21.

In Example 21, the phosphor was found to allow excitation at 343 nm most efficiently, and the emission spectrum was found to emit light having a peak at 472 nm when the phosphor was excited at 343 nm. Further, an emission color of the phosphor of Example 21 was confirmed to be within the following range:

$$0.05 \leq x \leq 0.3; \text{ and}$$

$$0.02 \leq y \leq 0.4$$

in the CIE 1931 chromaticity coordinates. Similar emission spectra were confirmed in a similar manner for all of the phosphors in the other Examples.

TABLE 6

Excitation Emission Characteristics in Examples
and Comparative Examples of Phosphor Synthesis
Excitation emission characteristics in examples
and comparative examples of phosphor synthesis

| Example | | Excitation spectrum | Emission spectrum | |
|---|---|---|---|---|
| | | Peak wavelength (nm) | Peak wavelength (nm) | Intensity Arbitrary unit |
| Comparative example | 1 | | | 0.00 |
| Example | 2 | 343 | 467 | 0.96 |
| Example | 3 | 344 | 473 | 1.08 |
| Example | 4 | 371 | 574 | 0.05 |
| Example | 5 | 400 | 563 | 0.26 |
| Example | 6 | 342 | 465 | 1.06 |
| Example | 7 | 344 | 471 | 1.57 |
| Example | 8 | 336 | 487 | 0.56 |
| Example | 9 | 351 | 475 | 0.56 |
| Example | 10 | 344 | 478 | 0.78 |
| Example | 11 | 340 | 411 | 0.43 |
| Example | 12 | 274 | 635 | 0.03 |
| Example | 13 | 441 | 793 | 0.14 |
| Example | 14 | 441 | 793 | 0.03 |
| Example | 15 | 254 | 542 | 0.19 |
| Example | 16 | 537 | 784 | 0.03 |
| Example | 17 | 434 | 796 | 0.04 |
| Example | 18 | 254 | 585 | 0.08 |
| Example | 19 | 343 | 466 | 0.83 |
| Example | 20 | 341 | 468 | 0.98 |
| Example | 21 | 343 | 472 | 1.16 |

TABLE 6-continued

Excitation Emission Characteristics in Examples
and Comparative Examples of Phosphor Synthesis
Excitation emission characteristics in examples
and comparative examples of phosphor synthesis

| Example | Excitation spectrum Peak wavelength (nm) | Emission spectrum Peak wavelength (nm) | Intensity Arbitrary unit |
|---|---|---|---|
| Example 22 | 340 | 457 | 0.95 |
| Example 23 | 298 | 439 | 0.59 |
| Example 24 | 346 | 476 | 1.28 |
| Example 25 | 372 | 479 | 1.24 |
| Example 26 | 344 | 475 | 0.64 |
| Example 27 | 344 | 472 | 1.01 |
| Example 28 | 341 | 466 | 0.93 |
| Example 29 | 340 | 465 | 1.09 |
| Example 30 | 342 | 463 | 1.18 |
| Example 31 | 345 | 465 | 1.17 |
| Example 32 | 347 | 463 | 1.33 |
| Example 33 | 393 | 563 | 0.12 |
| Example 34 | 299 | 522 | 0.38 |
| Example 35 | 295 | 522 | 0.21 |
| Example 36 | 343 | 478 | 0.40 |
| Example 37 | 346 | 473 | 1.22 |
| Example 38 | 343 | 472 | 0.92 |
| Example 39 | 299 | 465 | 0.45 |
| Example 40 | 369 | 586 | 0.19 |
| Example 41 | 349 | 472 | 1.49 |
| Example 42 | 338 | 455 | 1.04 |
| Example 43 | 294 | 436 | 0.64 |
| Example 44 | 357 | 474 | 1.55 |
| Example 45 | 361 | 479 | 1.41 |
| Example 46 | 344 | 473 | 1.05 |
| Example 47 | 345 | 472 | 1.28 |
| Example 48 | 343 | 467 | 1.11 |
| Example 49 | 340 | 464 | 1.42 |
| Example 50 | 341 | 463 | 1.31 |
| Example 51 | 344 | 464 | 1.18 |
| Example 52 | 343 | 462 | 1.49 |
| Example 53 | 440 | 573 | 0.16 |
| Example 54 | 298 | 523 | 0.43 |
| Example 55 | 298 | 519 | 0.32 |
| Example 56 | 371 | 477 | 0.51 |
| Example 57 | 343 | 471 | 1.29 |
| Example 58 | 343 | 467 | 1.06 |
| Example 59 | 296 | 467 | 0.43 |
| Example 60 | 350 | 586 | 0.16 |
| Example 61 | 341 | 479 | 0.59 |
| Example 62 | 341 | 477 | 0.93 |
| Example 63 | 341 | 479 | 0.98 |
| Example 64 | 338 | 478 | 1.16 |
| Example 65 | 331 | 479 | 1.19 |
| Example 66 | 342 | 479 | 1.19 |

According to Table 6, the phosphor of the present invention was found to be excited with light having a wavelength of 295 nm to 540 nm so as to emit light of a blue color to a red color. For example, according to Examples in which the inorganic crystal includes Eu as the M element, and the A element is Sr or a combination of Sr and Ba, the phosphor of the present invention was found to be excited mainly with ultraviolet light having a wavelength of 295 nm to 380 nm or purple light of 380 nm to 420 nm so as to emit light of a blue color to a blue-green color with high brightness.

According to Table 2 and Table 6, it is shown that substance of each Example is an inorganic compound designated by a composition formula $M_d A_e D_f E_g X_h$ (here, in the formula, d+e+f+g+h=1, M is one or two or more kinds of elements selected from Mn, Ce, Pr, Nd, Sm, Eu, Tb, Dy, and Yb; A is one or two or more kinds of elements selected from Mg, Ca, Sr, and Ba; D is one or two or more kinds of elements selected from Si, Ge, Sn, Ti, Zr, and Hf; E is one or two or more kinds of elements selected from B, Al, Ga, In, Sc, Y, and La; X is one or two or more kinds of elements selected from O, N, and F), in which parameters d, e, f, g, and h satisfy all the following conditions:

$$0.00001 \leq d \leq 0.05;$$

$$0.05 \leq e \leq 0.1;$$

$$0.07 \leq f \leq 0.3;$$

$$0.07 \leq g \leq 0.3; \text{ and}$$

$$0.45 \leq h \leq 0.6,$$

and each is also shown to be a phosphor.

For example, it was confirmed that the inorganic compound in which the M element was Eu emitted fluorescence having a peak in a wavelength range from 400 nm to 590 nm upon irradiation by an ultraviolet ray or visible light according to Examples 2 to 10 and 19 to 66. It was confirmed that the inorganic compound, in which the M element was Eu; the A element is Sr and Ba; the D element was Si; the Element was Al; and the X element included N and O, emitted fluorescence of a blue color having a peak in a wavelength range from 440 nm to 520 nm according to Examples 7, 21 to 25, 27 to 31, 35 to 45, 47 to 51, and 55 to 60.

According to Table 3 summarizing what is converted as appropriate from parameters of Table 2, any of the Examples satisfied:

$$0.5/5 \leq (d+e)/(f+g) \leq 2/5$$

in the above composition formula. For example, according to Examples 61 to 66, it was confirmed that the following relationship:

$$0.9/5 \leq (d+e)/(f+g) \leq 1.2/5$$

was satisfied in the above composition formula and then emission of high brightness was performed. Further, according to Examples 62 to 66, it was confirmed that the following relationship:

$$1.0/5 \leq (d+e)/(f+g) \leq 1.2/5$$

was satisfied in the above composition formula and then emission of further high brightness was performed.

For example, according to Examples 35 to 39 and 55 to 59, it was confirmed that the following relationship:

$$2/5 \leq f/(f+g) \leq 4/5$$

was satisfied in the above composition formula and then emission of high brightness was performed.

For example, according to Examples 56 to 58 and 61 to 66, it was confirmed that the following relationship:

$$3.5/8 \leq h1/(h1+h2) \leq 4.5/8$$

was satisfied in the above composition formula and then emission of high brightness was performed.

Figure 4:
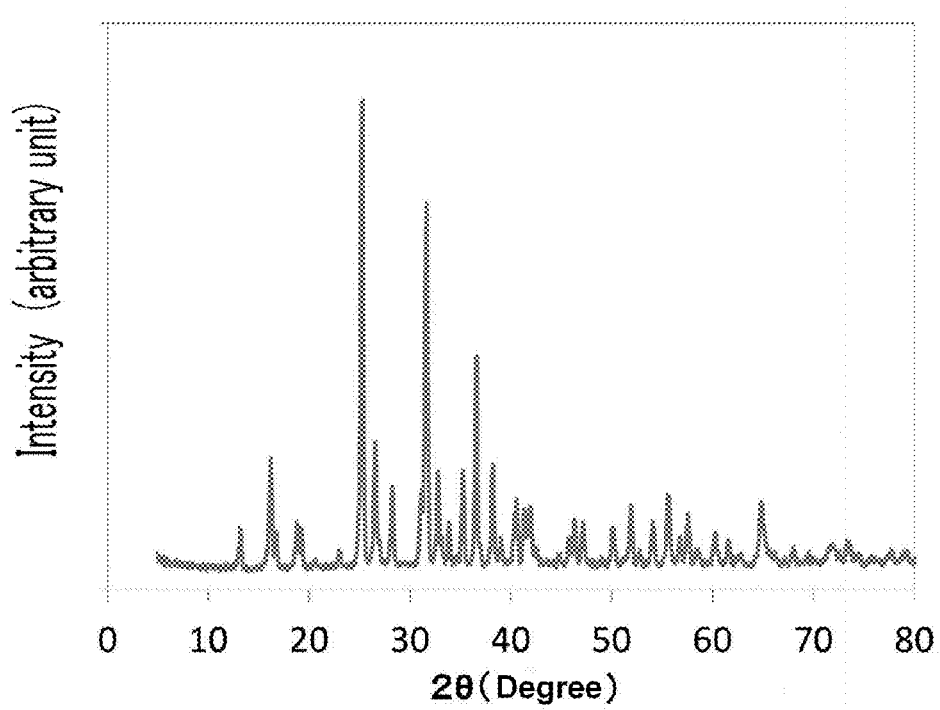
FIG. 4 is a diagram showing a resultant powder X-ray diffraction pattern of a phosphor synthesized in Example 21.

Next, with respect to each synthesized compound, the powder X-ray diffraction measurement using Cu Kα line was carried out. The result is shown in FIG. 4. Main formation phases are shown in Table 7. As a result, it was confirmed that a phase having a crystal structure identical to the crystal structure of the $Sr_1Si_3Al_2O_4N_4$ crystal was the main formation phases. With respect to the formation phase, it is described in more detail later.

TABLE 7

Main Formation Phases in Examples and
Comparative Examples of Phosphor Synthesis
Main formation phases in examples and
comparative examples of phosphor synthesis

| Example | Crystal structures of Main formation phases |
|---|---|
| Comparative example 1 | Crystal structures of Main formation phases |
| Example 2 | Crystal structure identical to that of $Sr_1Si_3Al_2O_4N_4$ |
| Example 3 | Crystal structure identical to that of $Sr_1Si_3Al_2O_4N_4$ |
| Example 4 | Crystal structure identical to that of $Sr_1Si_3Al_2O_4N_4$ |
| Example 5 | Crystal structure identical to that of $Sr_1Si_3Al_2O_4N_4$ |
| Example 6 | Crystal structure identical to that of $Sr_1Si_3Al_2O_4N_4$ |
| Example 7 | Crystal structure identical to that of $Sr_1Si_3Al_2O_4N_4$ |
| Example 8 | Crystal structure identical to that of $Sr_1Si_3Al_2O_4N_4$ |
| Example 9 | Crystal structure identical to that of $Sr_1Si_3Al_2O_4N_4$ |
| Example 10 | Crystal structure identical to that of $Sr_1Si_3Al_2O_4N_4$ |
| Example 11 | Crystal structure identical to that of $Sr_1Si_3Al_2O_4N_4$ |
| Example 12 | Crystal structure identical to that of $Sr_1Si_3Al_2O_4N_4$ |
| Example 13 | Crystal structure identical to that of $Sr_1Si_3Al_2O_4N_4$ |
| Example 14 | Crystal structure identical to that of $Sr_1Si_3Al_2O_4N_4$ |
| Example 15 | Crystal structure identical to that of $Sr_1Si_3Al_2O_4N_4$ |
| Example 16 | Crystal structure identical to that of $Sr_1Si_3Al_2O_4N_4$ |
| Example 17 | Crystal structure identical to that of $Sr_1Si_3Al_2O_4N_4$ |
| Example 18 | Crystal structure identical to that of $Sr_1Si_3Al_2O_4N_4$ |
| Example 19 | Crystal structure identical to that of $Sr_1Si_3Al_2O_4N_4$ |
| Example 20 | Crystal structure identical to that of $Sr_1Si_3Al_2O_4N_4$ |
| Example 21 | Crystal structure identical to that of $Sr_1Si_3Al_2O_4N_4$ |
| Example 22 | Crystal structure identical to that of $Sr_1Si_3Al_2O_4N_4$ |
| Example 23 | Crystal structure identical to that of $Sr_1Si_3Al_2O_4N_4$ |
| Example 24 | Crystal structure identical to that of $Sr_1Si_3Al_2O_4N_4$ |
| Example 25 | Crystal structure identical to that of $Sr_1Si_3Al_2O_4N_4$ |
| Example 26 | Crystal structure identical to that of $Sr_1Si_3Al_2O_4N_4$ |
| Example 27 | Crystal structure identical to that of $Sr_1Si_3Al_2O_4N_4$ |
| Example 28 | Crystal structure identical to that of $Sr_1Si_3Al_2O_4N_4$ |
| Example 29 | Crystal structure identical to that of $Sr_1Si_3Al_2O_4N_4$ |
| Example 30 | Crystal structure identical to that of $Sr_1Si_3Al_2O_4N_4$ |
| Example 31 | Crystal structure identical to that of $Sr_1Si_3Al_2O_4N_4$ |
| Example 32 | Crystal structure identical to that of $Sr_1Si_3Al_2O_4N_4$ |
| Example 33 | Crystal structure identical to that of $Sr_1Si_3Al_2O_4N_4$ |
| Example 34 | Crystal structure identical to that of $Sr_1Si_3Al_2O_4N_4$ |
| Example 35 | Crystal structure identical to that of $Sr_1Si_3Al_2O_4N_4$ |
| Example 36 | Crystal structure identical to that of $Sr_1Si_3Al_2O_4N_4$ |
| Example 37 | Crystal structure identical to that of $Sr_1Si_3Al_2O_4N_4$ |
| Example 38 | Crystal structure identical to that of $Sr_1Si_3Al_2O_4N_4$ |
| Example 39 | Crystal structure identical to that of $Sr_1Si_3Al_2O_4N_4$ |
| Example 40 | Crystal structure identical to that of $Sr_1Si_3Al_2O_4N_4$ |
| Example 41 | Crystal structure identical to that of $Sr_1Si_3Al_2O_4N_4$ |
| Example 42 | Crystal structure identical to that of $Sr_1Si_3Al_2O_4N_4$ |
| Example 43 | Crystal structure identical to that of $Sr_1Si_3Al_2O_4N_4$ |
| Example 44 | Crystal structure identical to that of $Sr_1Si_3Al_2O_4N_4$ |
| Example 45 | Crystal structure identical to that of $Sr_1Si_3Al_2O_4N_4$ |
| Example 46 | Crystal structure identical to that of $Sr_1Si_3Al_2O_4N_4$ |
| Example 47 | Crystal structure identical to that of $Sr_1Si_3Al_2O_4N_4$ |
| Example 48 | Crystal structure identical to that of $Sr_1Si_3Al_2O_4N_4$ |
| Example 49 | Crystal structure identical to that of $Sr_1Si_3Al_2O_4N_4$ |
| Example 50 | Crystal structure identical to that of $Sr_1Si_3Al_2O_4N_4$ |
| Example 51 | Crystal structure identical to that of $Sr_1Si_3Al_2O_4N_4$ |
| Example 52 | Crystal structure identical to that of $Sr_1Si_3Al_2O_4N_4$ |
| Example 53 | Crystal structure identical to that of $Sr_1Si_3Al_2O_4N_4$ |
| Example 54 | Crystal structure identical to that of $Sr_1Si_3Al_2O_4N_4$ |
| Example 55 | Crystal structure identical to that of $Sr_1Si_3Al_2O_4N_4$ |
| Example 56 | Crystal structure identical to that of $Sr_1Si_3Al_2O_4N_4$ |
| Example 57 | Crystal structure identical to that of $Sr_1Si_3Al_2O_4N_4$ |
| Example 58 | Crystal structure identical to that of $Sr_1Si_3Al_2O_4N_4$ |
| Example 59 | Crystal structure identical to that of $Sr_1Si_3Al_2O_4N_4$ |
| Example 60 | Crystal structure identical to that of $Sr_1Si_3Al_2O_4N_4$ |
| Example 61 | Crystal structure identical to that of $Sr_1Si_3Al_2O_4N_8$ |
| Example 62 | Crystal structure identical to that of $Sr_1Si_3Al_2O_4N_8$ |
| Example 63 | Crystal structure identical to that of $Sr_1Si_3Al_2O_4N_8$ |
| Example 64 | Crystal structure identical to that of $Sr_1Si_3Al_2O_4N_8$ |
| Example 65 | Crystal structure identical to that of $Sr_1Si_3Al_2O_4N_8$ |
| Example 66 | Crystal structure identical to that of $Sr_1Si_3Al_2O_4N_8$ |

FIG. 4 is a diagram showing a resultant powder X-ray diffraction pattern of a phosphor synthesized in Example 21.

The powder X-ray diffraction pattern of FIG. 4 includes a powder X-ray diffraction pattern of the $Sr_1Si_3Al_2O_4N_4$ crystal as shown in FIG. 2 such that it can be confirmed that a phase having a crystal structure identical to that of the $Sr_1Si_3Al_2O_4N_4$ crystal was the main formation phase. The same situation was confirmed as with the other examples although not shown in figures. In this way, if a powder X-ray diffraction pattern of an obtained phosphor includes the powder X-ray diffraction pattern as shown in FIG. 2, it can be confirmed that there exists an inorganic crystal comprising the crystal designated by $Sr_1Si_3Al_2O_4N_4$ according to the present invention. Since the powder X-ray diffraction pattern is shifted as the inter-plane distance d differs in accordance with $n\lambda=2d\cdot\sin\theta$ even if the substance has the identical crystal structure, even the shifted powder X-ray diffraction pattern (shift by the θ) belongs to the powder X-ray diffraction pattern of the $Sr_1Si_3Al_2O_4N_4$ crystal as shown in FIG. 2. Further, since it is known that widening (narrowing) width of the diffraction line occurs in accordance with the size difference of respective crystallites, a powder X-ray diffraction pattern having a wide or narrow width of the diffraction line may also belong to the powder X-ray diffraction pattern of the $Sr_1Si_3Al_2O_4N_4$ crystal as shown in FIG. 2. In particular, solid-solution of an element to cause the crystal to emit fluorescence to be mentioned later can be a factor for changing the inter-plane distance and may change the size of the crystallite such that the width of the diffraction line can be changed. Specifically, from the X-ray diffraction patter of FIG. 4, it could be said that the obtained inorganic compound includes an inorganic crystal comprising a crystal designated by $Sr_1Si_3Al_2O_4N_4$, or an inorganic crystal having the crystal structure identical to that of the crystal designated by $Sr_1Si_3Al_2O_4N_4$. Further, the amount of the inorganic crystal can be measured by a commercially available program.

Since the $Sr_1Si_3Al_2O_4N_4$ crystal per se does not include the fluorescent component, it is not a phosphor in itself (refer to Comparative Examples in Tables 2 to Table 5 and Table 6). Therefore, the emission spectrum as shown in FIG. 3 cannot be obtained. That is to say, it is possible to confirm the formation of a phosphor including an inorganic compound in which the M element (here, M is one or two or more kinds of elements selected from Mn, Ce, Pr, Nd, Sm, Eu, Tb, Dy, and Yb) is solid-solved into the inorganic crystal comprising the crystal designated by $Sr_1Si_3Al_2O_4N_4$ or the inorganic crystal having the crystal structure identical to that of the crystal designated by $Sr_1Si_3Al_2O_4N_4$, from detection of the $Sr_1Si_3Al_2O_4N_4$ crystal or the inorganic compound having the identical crystal structure thereto, detection of an element to become a fluorescent component, and presence of a specific emission spectrum to be explained with reference to FIG. 3 and Table 6.

The results of powder X-ray diffraction of the synthesized phosphors (FIG. 4) show a good agreement with the results of structure analysis (FIG. 2). In particular, in Example 21, the measured X-ray diffraction pattern is identical to that of the $Sr_1Si_3Al_2O_4N_4$ crystal, and the crystal having the crystal structure identical to that of the $Sr_1Si_3Al_2O_4N_4$ crystal was confirmed to be the main component. Further, in Example 21, the synthesized material was confirmed to include Eu, Sr, Ba, Si, Al, O, and N from the measurement by means of EDS. In addition, the ratios of Sr:Ba:Si:Al were confirmed to be 0.5: 0.5:3:2. That is, the synthesized material was confirmed to be a phosphor in which Eu is solid-solved into the $Sr_{0.5}Ba_{0.5}Si_3Al_2N_4O_4$ crystal.

Examples of Light-Emitting Unit and Image Display Device

Examples 67 to 70

Next, a light-emitting unit utilizing the phosphor of the present invention will be described.

Example 67

Figure 5:
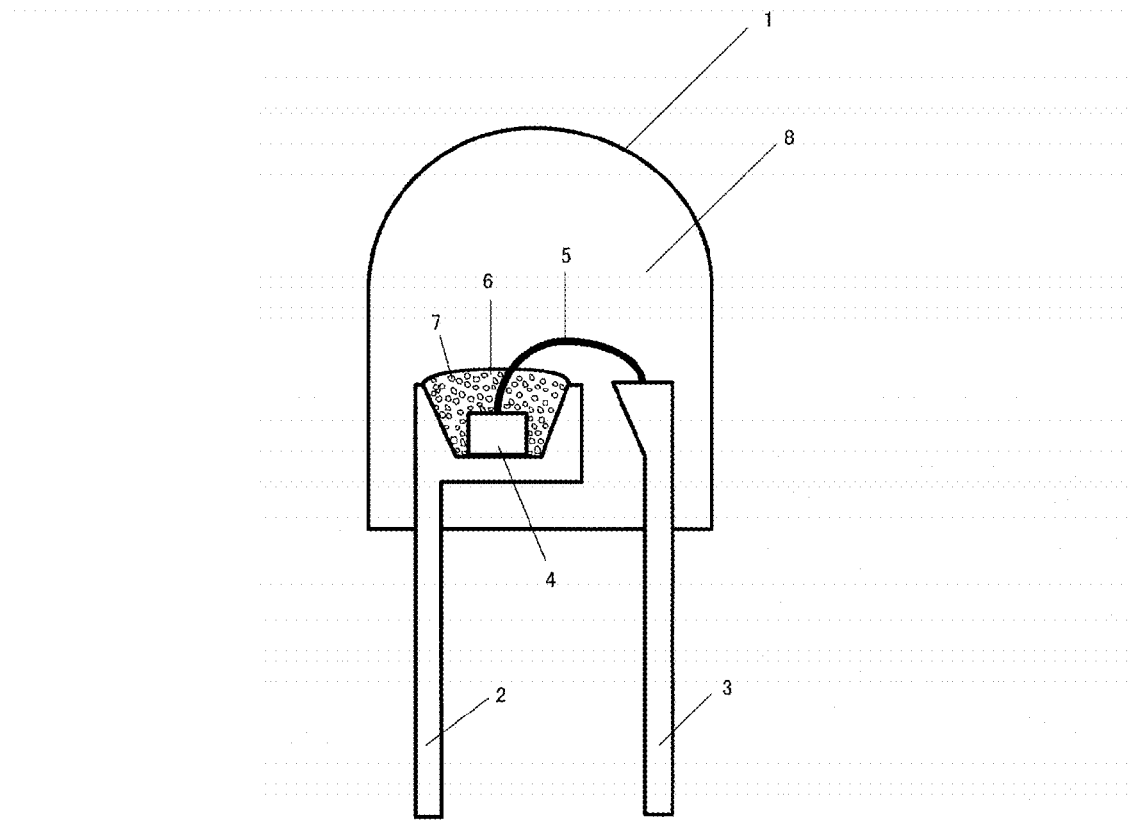
FIG. 5 is a schematic diagram showing an illuminating device (bullet-type of LED illuminating device) according to the present invention.

FIG. 5 is a schematic diagram showing an illuminating device (bullet-type of LED illuminating device) according to the present invention.

A so-called bullet-type white light-emitting diode lamp (1) as shown in FIG. 5 was produced. There are two lead wires (2, 3), one of which (2) has a recess, in which a blue light-emitting diode element (4) having an emission peak of 365 nm is placed. The lower electrode of the ultraviolet light-emitting diode element (4) and the bottom surface of the recess are electrically connected with conductive paste, and the upper electrode and the other lead wire (3) are electrically connected through a gold thin wire (5). The phosphor (7) is dispersed in resin and mounted in the vicinity of the light-emitting diode element (4). The first resin (6) in which this phosphor is dispersed is transparent, and covers the entire ultraviolet light-emitting diode element (4). The tip-top portion of the lead wire including the recess, the blue light-emitting diode element, and the first resin in which the phosphor is dispersed are sealed with transparent second resin (8). A second resin (8) which is transparent is formed approximately in a cylindrical shape as a whole and the top portion is rounded in a lens shape such that the lamp is generally referred to as a bullet-type.

In the present embodiment, the first resin (6) was formed to have phosphors dispersed by dropping an appropriate amount of a mixture of blended phosphors and resin with a dispenser, the mixture was prepared by mixing the blended phosphors with epoxy resin by the concentration of 37 wt %, and the blended phosphors were prepared by blending the phosphor in powder prepared for Example 21 and a yellow phosphor of α-sialon:Eu in powder with the ratio by weight of 7 to 3. The light emitted by the thus-obtained light-emitting unit had an emission color of white and characterized by x=0.33 and y=0.33 in the color coordinates.

Example 68

Figure 6:
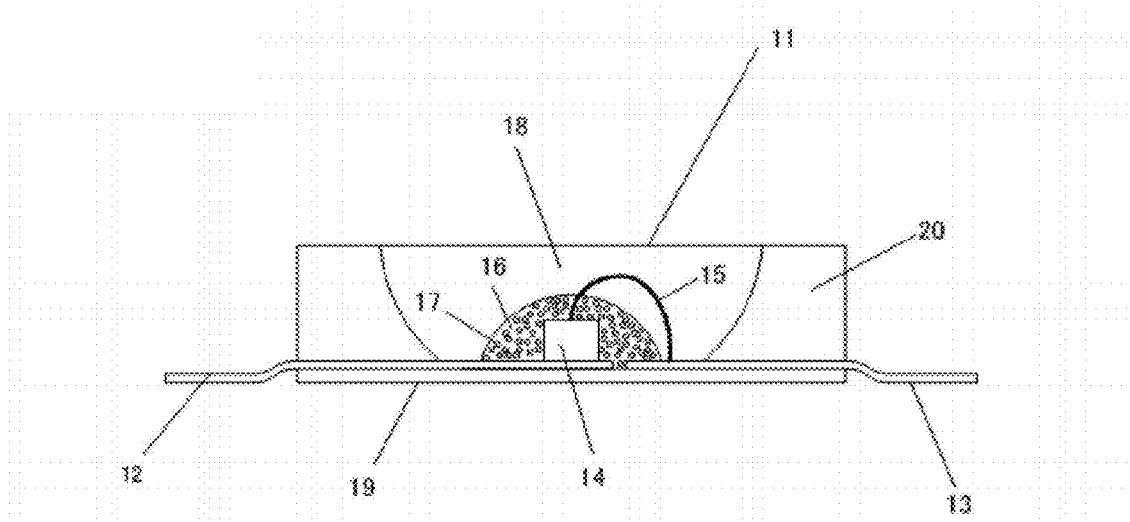
FIG. 6 is a schematic diagram showing an illuminating device (board-mounting-type LED illuminating device) according to the present invention.

FIG. 6 is a schematic diagram showing an illuminating device (board-mounting-type LED illuminating device) according to the present invention.

A chip-type white light-emitting diode lamp (11) for board-mounting as shown in FIG. 6 was produced. Two lead wires (12, 13) are fixed to a white alumina ceramic board (19) having high reflectance of visible light and one end of each of the wires is located at approximately the center portion of the board and the other end of each of the wires extends outside to serve as an electrode to be soldered when the lamp is mounted on the electric board. One (12) of the lead wires has the one end on which an ultraviolet light-emitting diode element (14) having an emission peak wavelength of 365 nm is place and fixed thereto such that the element is located at the center of the board. The lower electrode of the ultraviolet light-emitting diode element (14) and the lead wire beneath the element are electrically connected with conductive paste, and the upper electrode and the other lead wire (13) are electrically connected through a gold thin wire (15).

A material prepared by mixing the first resin (16) and a blended phosphor (17) prepared by blending the phosphor prepared for Example 21 and a yellow phosphor of α-sialon:Eu with the ratio by weight of 7 to 3 is mounted in the vicinity of the light-emitting diode element. The first resin in which this phosphor is dispersed is transparent, and covers the entire ultraviolet light-emitting diode element (14). Also, a wall surface member (20) having a hole opened at the center portion is fixed to the ceramic board. The wall surface member (20) has the center portion formed as the hole in which the ultraviolet light-emitting diode element (14) and the resin (16) having the phosphor (17) dispersed therein are contained and the portion of the hole facing the center is made to be a slope. This slope is a reflective surface for taking out light forward, and the shape of the curved surface of the slope is determined in consideration of the direction of light reflection. Further, at least the surface which constitutes the reflective surface forms a surface having high visible light reflectance with white color or metallic luster. In the present example, the wall surface member (20) is configured with white silicone resin. The hole at the center portion of the wall surface member is formed with a recess as the final shape of the chip-type light emitting diode lamp, and is filled up with second transparent resin (18) to seal all of the ultraviolet light-emitting diode element (14) and the first resin (16) in which the phosphor (17) is dispersed. In the present example, the same epoxy resin was used for both the first resin (16) and second resin (18). The addition percentage of the phosphor, the achieved chromaticity, and the like are approximately identical to those in Example 67.

Next, a design example of an image display device using the phosphor of the present invention is described.

Example 69

Figure 7:
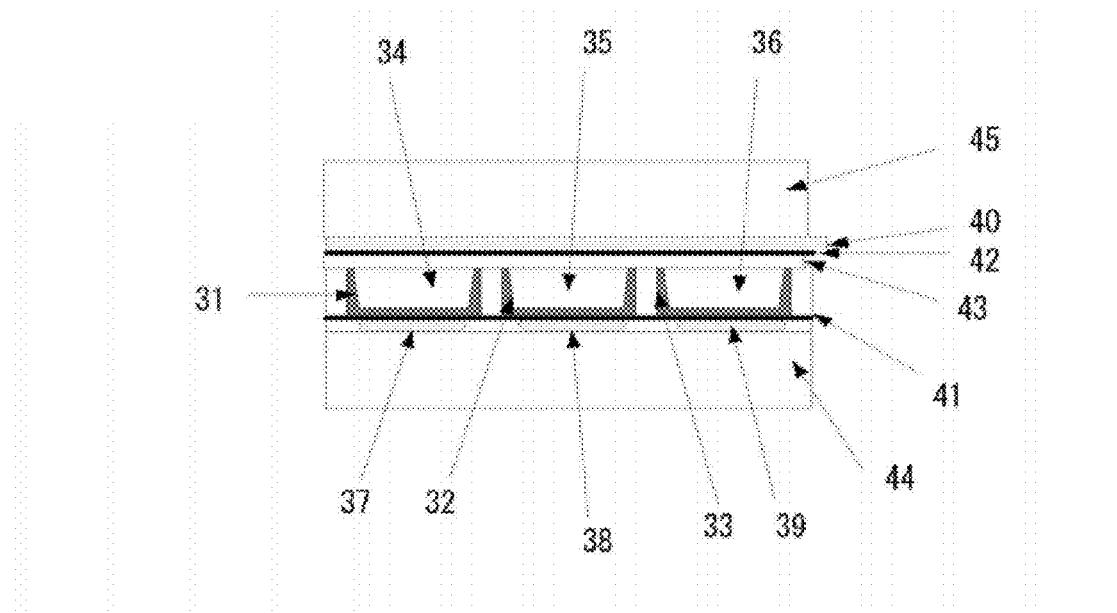
FIG. 7 is a schematic diagram showing an image display device (plasma display panel) according to the present invention.

FIG. 7 is a schematic diagram showing an image display device (plasma display panel) according to the present invention.

A red phosphor ($CaAlSiN_3:Eu^{2+}$) (31), a green phosphor (β-sialon:$Eu^{2+}$) (32), and the blue phosphor (33) of Example 21 according to the present invention are applied to inner surfaces of the respective cells (34, 35, 36), which are arranged via electrodes (37, 38, 39) and a dielectric layer (41) over a glass board (44). If electric power is supplied to the electrodes (37, 38, 39, 40), a vacuum ultraviolet ray is generated by Xe discharge in each of the cells, thereby exciting the respective phosphors so as to emit visible light of a red color, a green color, or a blue color such that the emitted light may be observed from the outside through a protective layer (43), a dielectric layer (42), and a glass board (45) so as to serve as an image display.

Example 70

Figure 8:
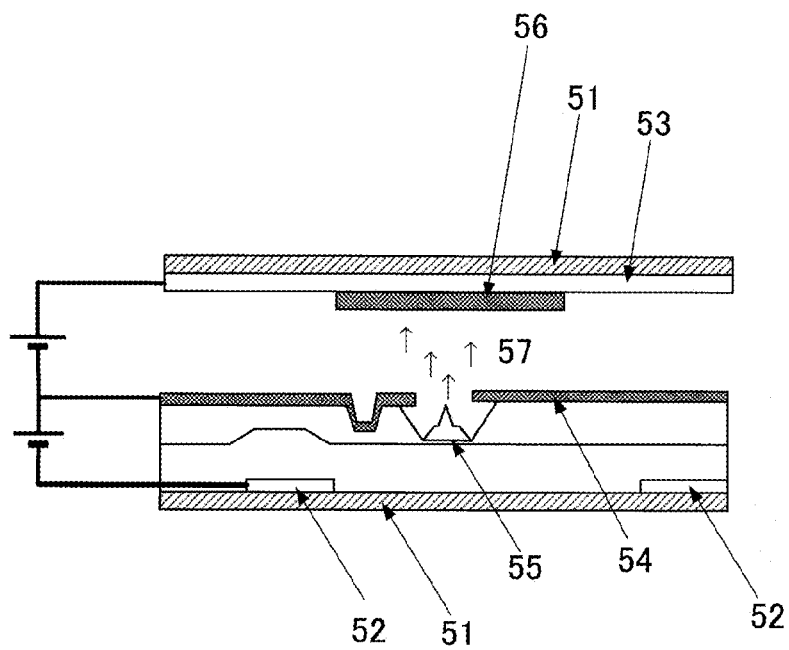
FIG. 8 is a schematic diagram showing an image display device (field emission display panel) according to the present invention.

FIG. 8 is a schematic diagram showing an image display device (field emission display panel) according to the present invention.

The blue phosphor (56) of Example 30 of the present invention is applied to an interior surface of an anode (53). By applying a voltage between a cathode (52) and a gate (54), electrons (57) are emitted from an emitter (55). The electrons are accelerated by the voltage between the anode (53) and cathode (52), and impinge on the blue phosphor (56) to excite the phosphor to emit light. The entire device is protected by a glass (51). Although the drawing shows a single light emission cell comprising one emitter and one phosphor, a display is actually configured to emit light of a variety of color by arranging many cells for a green color and a red color in addition to for the blue color. Although the phosphors to be used for cells of a green color and a red color are not particularly specified, a phosphor which shows high brightness under a low speed electron beam is preferable.

The nitride phosphor of the present invention has different emission characteristics (emission color and excitation characteristics, emission spectrum) from those of the conventional phosphor, exhibits high emission intensity in the case where it is combined with a LED of 470 nm or less, is chemically and thermally stable, and further has little degradation in the intensity of the phosphor when it is exposed to the excitation source such that it is a nitride phosphor to be used suitably for the VFD, the FED, the PDP, the CRT, and the white LED. It is expected that the phosphor of the present invention will be utilized in material design in various kinds of display devices so as to contribute to the development of the industry.

What is claimed is:

1. A phosphor comprising: an inorganic compound wherein the inorganic compound is expressed by a compositional formula of $M_dA_eD_fE_gX_h$ (where d+e+f+g+h=1; an M element is one or more kinds of elements selected from the group consisting of Mn, Ce, Pr, Nd, Sm, Eu, Tb, Dy, and Yb; an A element is one or more kinds of elements selected from the group consisting of Mg, Ca, Sr, and Ba; a D element is one or more kinds of elements selected from the group consisting of Si, Ge, Sn, Ti, Zr, and Hf; an E element is one or more kinds of elements selected from the group consisting of B, Al, Ga, In, Sc, Y, and La; and an X element is one or more kinds of elements selected from the group consisting of O, N, and F,) and parameters d, e, f, g, and h satisfy following condition:

$0.00001 \leq d \leq 0.05$;

$0.05 \leq e \leq 0.1$;

$0.07 \leq f \leq 0.3$;

$0.07 \leq g \leq 0.3$; and $0.45 \leq h \leq 0.6$ wherein the inorganic compound comprises: an inorganic crystal constituted of a crystal expressed by $Sr_1SiAl_2O_4N_4$, another inorganic crystal having a same crystal structure as the crystal expressed by the $Sr_1Si_3Al_2O_4N_4$, or a solid-solution crystal thereof, into which an M element is solid-solved wherein M is one or more kinds of elements selected from the group consisting of Mn, Ce, Pr, Nd, Sm, Eu, Tb, Dy, and Yb.

2. The phosphor according to claim 1, comprising the inorganic compound satisfying a relationship of:

$0.5/5 \leq (d+e)/(f+g) \leq 2/5$ in the composition formula.

3. The phosphor according to claim 2, comprising the inorganic compound satisfying a relationship of:

$0.9/5 \leq (d+e)/(f+g) \leq 1.2/5$ in the composition formula.

4. The phosphor according to claim 1,
wherein values of the parameters d, e, f, g, and h of the composition formula are within a range satisfy all conditions of:

$0.06 \leq d+e \leq (1/14)+0.05$;

$(5/14)-0.05 \leq f+g \leq (5/14)+0.05$; and $(8/14)-0.05 \leq h \leq 0.6$.

5. The phosphor according to claim 1, comprising the inorganic compound having the composition formula in which the parameters f and g satisfy a condition of:

$2/5 \leq f/(f+g) \leq 4/5$.

6. The phosphor according to claim 1, comprising the inorganic compound having a composition formula of $M_dA_eD_fE_gO_{h1}N_{h2}$ (wherein, d+e+f+g+h1+h2=1 and h1+h2=h in the formula),
wherein the X element includes N and O and a condition of:

$2/8 \leq h1/(h1+h2) \leq 6/8$ is satisfied.

7. The phosphor according to claim 6, comprising the inorganic compound satisfying a condition of:

$3.5/8 \leq h1/(h1+h2) \leq 4.5/8$ in the composition formula.

8. The phosphor according to claim 1
wherein at least Eu is included as the M element.

9. The phosphor according to claim 1,
wherein at least Sr and/or Ba is included as the A element, at least Si is included as the D element, at least Al is included as the E element, and at least N and O are included as the X element.

10. The phosphor according to claim 9,
wherein at least Sr and Ba are included as the A element.

11. The phosphor according to claim 9,
wherein 0.001 mass % or more and 1 mass % or less of boron is included as the E element.

12. The phosphor according to claim 1,
wherein the inorganic compound includes a single crystal particle or an aggregate thereof having a mean particle diameter equal to or more than 0.1 μm and equal to or less than 20 μm.

13. The phosphor according to claim 1,
wherein a sum of Fe, Co, and Ni impurity elements included in the inorganic compound does not exceed 500 ppm.

14. The phosphor according to claim 1, further comprising an amorphous phase or a crystal phase that is different from the inorganic compound in addition to the inorganic compound,
wherein a content amount of the inorganic compound is equal to or more than 20 mass %.

15. The phosphor according to claim 14,
wherein the amorphous phase or the crystal phase that is different from the inorganic compound is inorganic substance having electronic conductivity.

16. The phosphor according to claim 15,
wherein the inorganic substance having the electrical conductivity is oxide, oxynitride, nitride, or a combination thereof, any one of which includes one or more kinds of elements selected from a group consisting of Zn, Al, Ga, In, and Sn.

17. The phosphor according to claim 14,
wherein the amorphous phase or the crystal phase that is different from the inorganic compound is another phosphor.

18. The phosphor according to claim 1,
wherein the phosphor emits fluorescent having a peak in a wavelength range of 440 nm to 520 nm upon irradiation of an excitation source.

19. The phosphor according to claim 18,
wherein the excitation source is a vacuum ultraviolet ray, an ultraviolet ray, or visible light, each of which has a wavelength that is in each specific range among from 100 nm to 420 nm, or an electron beam or an X-ray.

20. The phosphor according to claim 1,
wherein a color of light emitted upon irradiation of an excitation source satisfies, in terms of values of (x, y) of CIE 1931 chromaticity coordinates, conditions:

$0.05 \leq x \leq 0.3$; and $0.02 \leq y \leq 0.4$.

21. The phosphor according to claim 1,
wherein, in the composition formula, the M element is Eu; the D element is Si; the E element is Al; and the X element is O and N, and
wherein the inorganic compound comprises an inorganic compound consisting of a crystal in which Eu is solid-solved and the crystal is expressed by $A_1Si_{3-x}Al_{2+x}O_{4+x}N_{4-x}$, wherein $-1 \leq x \leq 2$.

22. The phosphor according to claim 21,
wherein the A element is a combination of Sr and Ba.

23. The phosphor according to claim 22,
wherein the inorganic crystal is expressed, using parameters x and y, by:

$Eu_y(Sr,Ba)_1Si_{3-x}Al_{2+x}O_{4+x}N_{4-x}$ wherein $-1 \leq x \leq 2$, and $0.0001 \leq y \leq 0.5$.

24. The phosphor according to claim 21,
wherein the x is equal to 0.

25. The phosphor according to claim 21, wherein:
the A element is a combination of Sr and Ba,
the x is equal to 0, and
fluorescence of a blue color having 440 nm or more and 520 nm or less is emitted upon irradiation of light having 295 to 420 nm.

26. The phosphor according to claim 1,
wherein the inorganic crystal having the same crystal structure as the crystal expressed by $Sr_1Si_3Al_2O_4N_4$ is a crystal expressed by $A_1SiAl_2O_4N_4$ or $A_1(D, E)_5X_8$.

27. The phosphor according to claim 26,
wherein the A element includes either or both of Sr and Ba, the D element includes Si, the E element includes Al, X element includes N, and the X element further includes O if necessary.

28. The phosphor according to claim 1,
wherein the inorganic crystal having the same crystal structure as the crystal expressed by $Sr_1SiAl_2O_4N_4$ is a crystal expressed by $(Ba, Sr)_1Si Al_2O_4N_4$.

29. A method of manufacturing a phosphor comprising: the step of
firing a raw material mixture of metal compounds in a temperature range of 1,200° C. or higher to 2,200° C. or lower in an inert atmosphere including nitrogen
wherein the phosphor comprises: an inorganic compound expressed by a compositional formula of $M_dA_eD_fE_gX_h$ (where d+e+f+g+h=1; an M element is one or more kinds of elements selected from the group consisting of Mn, Ce, Pr, Nd, Sm, Eu, Tb, Dy, and Yb; an A element is one or more kinds of elements selected from the group consisting of Mg, Ca, Sr, and Ba; a D element is one or more kinds of elements selected from the group consisting of Si, Ge, Sn, Ti, Zr, and Hf; an E element is one or more kinds of elements selected from the group consisting of B, Al, Ga, In, Sc, Y, and La; and an X element is one or more kinds of elements selected from the group consisting of O, N, and F,) and parameters d, e, f, g, and h satisfy following condition:

$0.00001 \leq d \leq 0.05$;

$0.05 \leq e \leq 0.1$;

$0.07 \leq f \leq 0.3$;

$0.07 \leq g \leq 0.3$; and $0.45 \leq h \leq 0.6$ wherein the inorganic compound comprises: an inorganic crystal constituted of a crystal expressed by $Sr_1SiAl_2O_4N_4$, another inorganic crystal having a same crystal structure as the crystal expressed by the $Sr_1Si_3Al_2O_4N_4$, or a solid-solution crystal thereof, into which an M element is solid-solved wherein M is one or more kinds of elements selected from the group consisting of Mn, Ce, Pr, Nd, Sm, Eu, Tb, Dy, and Yb.

30. The method of manufacturing the phosphor according to claim 29,
wherein the mixture of metal compounds comprises: a compound including M, a compound including A, a compound including D, a compound including E, and a compound including X (wherein M is one or more kinds of elements selected from a group consisting of Mn, Ce, Pr, Nd, Sm, Eu, Tb, Dy, and Yb; A is one or more kinds of elements selected from a group consisting of Mg, Ca, Sr, and Ba; D is one or more kinds of elements selected from a group consisting of Si, Ge, Sn, Ti, Zr, and Hf; E is one or more kinds of elements selected from a group consisting of B, Al, Ga, In, Sc, Y, and La; and X is one or more kinds of elements selected from a group consisting of O, N, and F).

31. The method of manufacturing the phosphor according to claim 30, wherein:
the compound including M is a single kind of substance or a mixture of at least two kinds of substances selected from a group consisting of metal, silicide, oxide, carbonate, nitride, oxynitride, chloride, and fluoride or oxyfluoride, each of which includes M;
the compound including A is a single kind of substance or a mixture of at least two kinds of substances selected from a group consisting of metal, silicide, oxide, carbonate, nitride, oxynitride, chloride, and fluoride or oxyfluoride, each of which includes A; and
the compound including D is a single kind of substance or a mixture of at least two kinds of substances selected from a group consisting of metal, silicide, oxide, carbonate, nitride, oxynitride, chloride, and fluoride or oxyfluoride, each of which includes D.

32. The method of manufacturing the phosphor according to claim 29,
wherein the mixture of metal compounds includes at least nitride or oxide of europium; nitride, oxide, or carbonate of strontium and/or nitride, oxide, or carbonate of barium; silicon oxide or silicon nitride; and aluminum oxide or aluminum nitride.

33. The method of manufacturing the phosphor according to claim 29, wherein the inert atmosphere including nitrogen is a nitrogen gas atmosphere in a pressure range of 0.1 MPa or higher to 100 MPa or lower.

34. The method of manufacturing the phosphor according to claim 29, wherein the step of firing is performed after the metal compounds in a form of powder or aggregate are filled in a container as being maintained with a filling rate of 40% or less in a bulk density.

35. The method of manufacturing the phosphor according to claim 29,
wherein a container used for the step of firing is made of boron nitride.

36. The method of manufacturing the phosphor according to claim 29,
wherein the metal compounds are in the form of powders or aggregates and a mean particle diameter of powder particles or aggregates of the metal compounds is 500 μm or less.

37. The method of manufacturing the phosphor according to claim 29,
wherein the metal compounds are in the form of aggregates and a mean particle diameter of aggregates of the metal compounds is controlled to be 500 μm or less by means of a spray dryer, sieving or pneumatic classification.

38. The method of manufacturing the phosphor according to claim 29, wherein the firing is conducted by a pressureless sintering furnace or a gas pressure sintering furnace.

39. The method of manufacturing the phosphor according to claim 29,
wherein a mean particle diameter of phosphor powder synthesized by firing is controlled to be from 50 nm or more and 200 μm or less by at least one technique selected from pulverization, classification, and acid treatment.

40. The method of manufacturing the phosphor according to claim 29,
wherein a phosphor powder after firing is heat-treated at a temperature that is equal to or higher than 1,000° C. and equal to or lower than a firing temperature.

41. The method of manufacturing the phosphor according to claim 29,
wherein another inorganic compound to produce a liquid phase at a temperature equal to or less than the firing temperature is added to the mixture of metal compounds, which is then fired in the firing step.

42. The method of manufacturing the phosphor according to claim 41,
wherein the other inorganic compound to produce the liquid phase at the temperature equal to or less than the firing temperature is a mixture of one or more kinds of substances selected from a group consisting of fluoride, chloride, iodide, bromide, and phosphate of one or more elements selected from a group consisting of Li, Na, K, Mg, Ca, Sr, and Ba.

43. The method of manufacturing the phosphor according to claim 41,
wherein a content amount of the other inorganic compound to produce the liquid phase at the temperature equal to or less than the firing temperature is reduced by washing with a solvent after the step of firing.

44. A light-emitting unit comprising a light-emitting body and a first phosphor,
wherein the first phosphor is the phosphor recited in claim 1.

45. The light-emitting unit according to claim 44,
wherein the light-emitting body is an organic EL light-emitting body (OLED), a semiconductor laser, a laser diode (LD), or a light-emitting diode (LED) emitting light of a wavelength of 330 to 500 nm.

46. The light-emitting unit according to claim 44,
wherein the light-emitting unit is a white light-emitting diode, an illuminating device including a plurality of white light-emitting diodes, or a backlight for a liquid crystal panel.

47. The light-emitting unit according to claim 44, further comprising a second phosphor, wherein:
the light-emitting body emits ultraviolet or visible light having a peak wavelength of 300 to 420 nm, and
the light-emitting unit emits white light or light other than the white light by mixing blue light emitted from the first phosphor and light having a wavelength of 470 nm or more emitted from the second phosphor.

48. The light-emitting unit according to claim 44, further comprising a blue phosphor being caused to emit light having a peak wavelength of 420 nm to 500 nm or less by the light-emitting body.

49. The light-emitting unit according to claim 48,
wherein the blue phosphor is selected from a group consisting of AlN:(Eu, Si), $BaMgAl_{10}O_{17}$:Eu, $SrSiAL_{19}ON_{31}$:Eu, $LaSi_9Al_{19}N_{32}$:Eu, α-sialon:Ce, and JEM:Ce.

50. The light-emitting unit according to claim 44, further comprising a green phosphor being caused to emit light having a peak wavelength of 500 nm or more to 550 nm or less by the light-emitting body.

51. The light-emitting unit according to claim 50,
wherein the green phosphor is selected from a group consisting of β-sialon:Eu, $(Ba, Sr, Ca, Mg)_2SiO_4$:Eu, and $(Ca, Sr, Ba)Si_2O_2N_2$:Eu.

52. The light-emitting unit according to claim 44, further comprising a yellow phosphor being caused to emit light having a peak wavelength of 550 nm or more to 600 nm or less by the light-emitting body.

53. The light-emitting unit according to claim 52,
wherein the yellow phosphor is selected from a group consisting of YAG:Ce, α-sialon:Eu, $CaAlSiN_3$:Ce, and $La_3Si_6N_{11}$:Ce.

54. The light-emitting unit according to claim 44, further comprising a red phosphor being caused to emit light having a peak wavelength of 600 nm or more to 700 nm or less by the light-emitting body.

55. The light-emitting unit according to claim 54,
wherein the red phosphor is selected from a group consisting of $CaAlSiN_3$:Eu, $(Ca, Sr)AlSiN_3$:Eu, $Ca_2Si_5N_8$:Eu, and $Sr_2Si_5N_8$:Eu.

56. The light-emitting unit according to claim 44,
wherein the light-emitting body is an LED for emitting light having a wavelength of 320 to 420 nm.

57. An image display device comprising: an excitation source and a phosphor,
wherein the phosphor comprises at least the phosphor recited in claim 1.

58. The image display device according to claim 57,
wherein the image display device is a fluorescent display tube (VFD), a field emission display (FED), a plasma display panel (PDP), a cathode-ray tube (CRT), or a liquid crystal display (LCD).

59. A pigment comprising the phosphor recited in claim 1.

60. An ultraviolet absorber comprising the phosphor recited in claim 1.

* * * * *